US006853654B2

(12) United States Patent
McDonald et al.

(10) Patent No.: US 6,853,654 B2
(45) Date of Patent: Feb. 8, 2005

(54) TUNABLE EXTERNAL CAVITY LASER

(75) Inventors: Mark E. McDonald, Milpitas, CA (US); Andrew Daiber, Palo Alto, CA (US); William B. Chapman, Sunnyvale, CA (US); Nadim Maluf, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 71 days.

(21) Appl. No.: 10/099,649

(22) Filed: Mar. 15, 2002

(65) Prior Publication Data

US 2002/0172239 A1 Nov. 21, 2002

Related U.S. Application Data

(63) Continuation-in-part of application No. 09/626,526, filed on Jul. 27, 2000.
(60) Provisional application No. 60/276,645, filed on Mar. 16, 2001, provisional application No. 60/276,813, filed on Mar. 16, 2001, provisional application No. 60/276,643, filed on Mar. 16, 2001, provisional application No. 60/276,760, filed on Mar. 16, 2001, provisional application No. 60/276,646, filed on Mar. 16, 2001, and provisional application No. 60/145,831, filed on Jul. 27, 1999.

(51) Int. Cl.[7] .................................................. H01S 3/98
(52) U.S. Cl. .......................... 372/20; 372/99; 372/102; 372/105
(58) Field of Search ................................ 372/20, 29.02, 372/98

(56) References Cited

U.S. PATENT DOCUMENTS

| 3,788,743 A | 1/1974 | George |
| 3,899,748 A | 8/1975 | Bodlaj |
| 3,921,099 A | 11/1975 | Abrams et al. |
| 3,965,440 A | 6/1976 | Graves |
| 3,967,211 A | 6/1976 | Itzkan et al. |
| 4,309,671 A | 1/1982 | Malyon |

(List continued on next page.)

FOREIGN PATENT DOCUMENTS

| EP | 0924628 A2 | 6/1999 |
| WO | WO 98/05105 | 2/1998 |
| WO | WO 98/44424 | 10/1998 |
| WO | WO 00/49689 | 8/2000 |
| WO | WO 01/04999 A1 | 1/2001 |
| WO | WO 02/078137 A1 | 10/2002 |
| WO | WO 03/005500 A2 | 1/2003 |
| WO | WO 03/005501 A2 | 1/2003 |
| WO | WO 03/005512 A2 | 1/2003 |

OTHER PUBLICATIONS

PCT International Search Report, Mar. 15, 2002.
Ketelsen, L. J. P., "Simple Technique for Measuring Cavity Loss in Semiconductor Lasers," *Electronics Letters*, (Aug. 18, 1994), vol. 30, No. 17, pp. 1422–1424.

(List continued on next page.)

*Primary Examiner*—Don Wong
*Assistant Examiner*—Cornelius H Jackson
(74) *Attorney, Agent, or Firm*—Blakely, Sokoloff, Taylor & Zafman LLP

(57) ABSTRACT

Apparatus and methods that utilize tunable elements to provide for selective wavelength tuning of a light beam. The apparatus comprises a first tunable wavelength selection element having a first adjustable free spectral range, a second tunable wavelength selection element having a second adjustable free spectral range, with the first and second tunable wavelength selection elements configured to define a tunable joint transmission peak. The first and second tunable wavelength selection elements respectively define first and second pluralities of tunable transmission peaks, wherein respective ones of each of the first and second plurality of transmission peaks are aligned to obtain a joint transmission peak that may be adjusted by tuning the wavelength selection elements. The free spectral ranges of the wavelength selection elements are configured to enable a Vernier tuning effect.

56 Claims, 20 Drawing Sheets

U.S. PATENT DOCUMENTS

| | | |
|---|---|---|
| 4,410,992 A | 10/1983 | Javan |
| 4,460,977 A | 7/1984 | Shimada et al. |
| 4,504,950 A | 3/1985 | Au Yeung |
| 4,560,246 A | 12/1985 | Cotter |
| 4,583,227 A | 4/1986 | Kirkby |
| 4,730,105 A | 3/1988 | Mitschke et al. |
| 4,770,047 A | 9/1988 | Arditty et al. |
| 4,839,614 A | 6/1989 | Hill et al. |
| 4,843,233 A | 6/1989 | Jeunhomme |
| 4,847,854 A | 7/1989 | Van Dijk |
| 4,870,269 A | 9/1989 | Jeunhomme et al. |
| 4,932,782 A | 6/1990 | Graindorge et al. |
| 4,934,816 A | 6/1990 | Silver et al. |
| 4,947,398 A * | 8/1990 | Yasuda et al. ......... 372/29.021 |
| 4,994,677 A | 2/1991 | Graindorge |
| 5,022,745 A | 6/1991 | Zayhowski et al. |
| 5,028,395 A | 7/1991 | Sebille et al. |
| 5,050,179 A | 9/1991 | Mooradian |
| 5,058,124 A | 10/1991 | Cameron et al. |
| 5,103,457 A | 4/1992 | Wallace et al. |
| 5,115,677 A | 5/1992 | Martin et al. |
| 5,124,993 A | 6/1992 | Braunlich et al. |
| 5,130,998 A | 7/1992 | Wakata et al. |
| 5,141,316 A | 8/1992 | Lefevre et al. |
| 5,163,063 A | 11/1992 | Yoshikawa et al. |
| 5,172,185 A | 12/1992 | Leuchs et al. |
| 5,181,071 A | 1/1993 | Lefevre et al. |
| 5,181,214 A | 1/1993 | Berger et al. |
| 5,185,643 A | 2/1993 | Vry et al. |
| 5,218,610 A | 6/1993 | Dixon |
| 5,225,930 A | 7/1993 | Land et al. |
| 5,245,626 A | 9/1993 | Burke et al. |
| 5,251,222 A | 10/1993 | Hester et al. |
| 5,263,037 A | 11/1993 | Trutna, Jr. et al. |
| 5,270,791 A | 12/1993 | Lefevre et al. |
| 5,289,491 A | 2/1994 | Dixon |
| 5,305,330 A | 4/1994 | Rieder et al. |
| 5,319,668 A | 6/1994 | Luecke |
| 5,321,717 A | 6/1994 | Adachi et al. |
| 5,327,447 A | 7/1994 | Mooradian |
| 5,331,651 A | 7/1994 | Becker et al. |
| 5,347,527 A | 9/1994 | Favre et al. |
| 5,349,439 A | 9/1994 | Graindorge et al. |
| 5,349,440 A | 9/1994 | DeGroot |
| 5,373,515 A | 12/1994 | Wakabayashi et al. |
| 5,387,974 A | 2/1995 | Nakatani |
| 5,412,474 A | 5/1995 | Reasenberg et al. |
| 5,412,676 A | 5/1995 | Schnier et al. |
| 5,414,280 A | 5/1995 | Girmay |
| 5,418,800 A | 5/1995 | Prior et al. |
| 5,420,687 A | 5/1995 | Kachanov |
| 5,428,700 A | 6/1995 | Hall |
| 5,438,579 A | 8/1995 | Eda et al. |
| 5,444,724 A | 8/1995 | Goto |
| 5,450,202 A | 9/1995 | Tisue |
| 5,473,625 A | 12/1995 | Hansen et al. |
| 5,543,916 A | 8/1996 | Kachanov |
| 5,583,638 A | 12/1996 | Cutler |
| 5,594,744 A | 1/1997 | Lefevre et al. |
| 5,606,439 A | 2/1997 | Wu |
| 5,631,736 A | 5/1997 | Thiel et al. |
| 5,651,018 A | 7/1997 | Mehuys et al. |
| 5,673,129 A | 9/1997 | Mizrahi |
| 5,712,704 A | 1/1998 | Martin et al. |
| 5,719,674 A | 2/1998 | Martin et al. |
| 5,737,109 A | 4/1998 | Goodwin |
| 5,751,750 A | 5/1998 | Friede et al. |
| 5,760,391 A | 6/1998 | Narendran |
| 5,777,773 A | 7/1998 | Epworth et al. |
| 5,802,085 A | 9/1998 | Lefevre et al. |
| 5,812,716 A | 9/1998 | Ohishi |
| 5,825,792 A | 10/1998 | Villeneuve et al. |
| 5,848,092 A | 12/1998 | Mitsumoto et al. |
| 5,862,162 A | 1/1999 | Maeda |
| 5,872,881 A | 2/1999 | Rossi et al. |
| 5,886,785 A | 3/1999 | Lefevre et al. |
| 5,917,188 A | 6/1999 | Atkinson et al. |
| 5,943,352 A | 8/1999 | Fee |
| 5,946,331 A | 8/1999 | Amersfoort et al. |
| 5,991,061 A | 11/1999 | Adams et al. |
| 6,018,535 A | 1/2000 | Maeda |
| 6,018,536 A | 1/2000 | Alphonse |
| 6,026,100 A | 2/2000 | Maeda |
| 6,034,799 A | 3/2000 | Hansen |
| 6,040,950 A | 3/2000 | Broome |
| 6,043,883 A | 3/2000 | Leckel et al. |
| 6,044,095 A | 3/2000 | Asano et al. |
| 6,061,369 A | 5/2000 | Conradi |
| 6,064,501 A | 5/2000 | Roberts et al. |
| 6,081,539 A | 6/2000 | Mattori et al. |
| 6,084,695 A | 7/2000 | Martin et al. |
| 6,108,355 A | 8/2000 | Zorabedian |
| 6,115,121 A | 9/2000 | Erskine |
| 6,115,401 A | 9/2000 | Scobey et al. |
| 6,141,370 A | 10/2000 | Avrutsky et al. |
| 6,151,337 A | 11/2000 | Carlsten et al. |
| 6,181,717 B1 | 1/2001 | Kner et al. |
| RE37,044 E | 2/2001 | Wu |
| 6,192,058 B1 | 2/2001 | Abeles |
| 6,201,638 B1 | 3/2001 | Hall et al. |
| 6,205,159 B1 | 3/2001 | Sesko et al. |
| 6,215,802 B1 | 4/2001 | Lunt |
| 6,229,835 B1 | 5/2001 | Tomaru et al. |
| 6,243,517 B1 | 6/2001 | Deacon |
| 6,246,480 B1 | 6/2001 | O'Brien |
| 6,249,364 B1 | 6/2001 | Martin et al. |
| 6,249,365 B1 | 6/2001 | Mizrahi et al. |
| 6,252,718 B1 | 6/2001 | Lefevre |
| 6,259,712 B1 | 7/2001 | DeCain et al. |
| 6,263,004 B1 | 7/2001 | Arvidsson et al. |
| 6,282,215 B1 * | 8/2001 | Zorabedian et al. .......... 372/20 |
| 6,301,274 B1 | 10/2001 | Tayebati et al. |
| 6,301,280 B1 | 10/2001 | Broutin et al. |
| 6,304,586 B1 | 10/2001 | Pease et al. |
| 6,314,115 B1 | 11/2001 | Delfyett et al. |
| 6,321,011 B2 | 11/2001 | Deacon |
| 6,324,204 B1 | 11/2001 | Deacon |
| 6,330,253 B1 | 12/2001 | Tuganov et al. |
| 6,331,892 B1 | 12/2001 | Green |
| 6,337,660 B1 | 1/2002 | Esman et al. |
| 6,366,592 B1 | 4/2002 | Flanders |
| 6,366,689 B1 | 4/2002 | Rao et al. |
| 6,404,538 B1 | 6/2002 | Chen et al. |
| 6,441,933 B1 | 8/2002 | Jang |
| 6,463,085 B1 | 10/2002 | Tayebati |
| 6,470,036 B1 | 10/2002 | Bailey et al. |
| 6,526,071 B1 | 2/2003 | Zorabedian et al. |
| 6,532,091 B1 | 3/2003 | Miyazaki et al. |
| 6,600,760 B1 | 7/2003 | Green et al. |
| 2002/0048297 A1 | 4/2002 | Irie et al. |
| 2002/0054614 A1 | 5/2002 | Hong |
| 2002/0126345 A1 | 9/2002 | Green et al. |
| 2002/0136104 A1 | 9/2002 | Daiber |

OTHER PUBLICATIONS

Shtengel, G. E., et al., "Internal Optical Loss Measurements in 1.3μm InGaAsP Lasers," *Electronic Letters*, (Jul. 6, 1995), vol. 31, No. 14, pp. 1157–1159.

Boggs. B. et al., "Simple High–Coherence Rapidly Tunable External–Cavity Diode Laser," *Optics Letters*, (Dec. 15, 1998), vol. 23, No. 24, pp. 1906–1908.

Favre, F. et al., "External–Cavity Semiconductor Laser With 15nm Continuous Tuning Range," *Electronics Letters*, vol. 22, No. 15, Jul. 19, 1986, pp. 795–796.

MacLeod, H.A., "Thin Film Optical Filters," $2^{nd}$ Edition, McGraw–Hill, 1989, pp. 244–269.

Mellis, J. et al., "Miniature Packaged External–Cavity Semiconductor Laser with 50GHz Continuous Electrical Tuning Range," *Electronics Letters*, vol. 24, No. 16, Apr. 22, 1988, pp. 988–989.

Rosenberg, K. P. et al., "Logarithmically Variable Infrared Etalon Filters," *SPIE*, vol. 2262, pp. 223–232.

Scobey, M. and Stupik, P., "Stable Ultra–Narrow Bandpass Filters," *SPIE*, vol. 2262, pp. 37–46.

Takahashi, H., "Temperature Stability of Thin–Film Narrow–Bandpass Filters Produced by Ion–Assisted Deposition," *Applied Optics*, vol. 34, No. 4, Feb. 1, 1995, pp. 667–675.

* cited by examiner

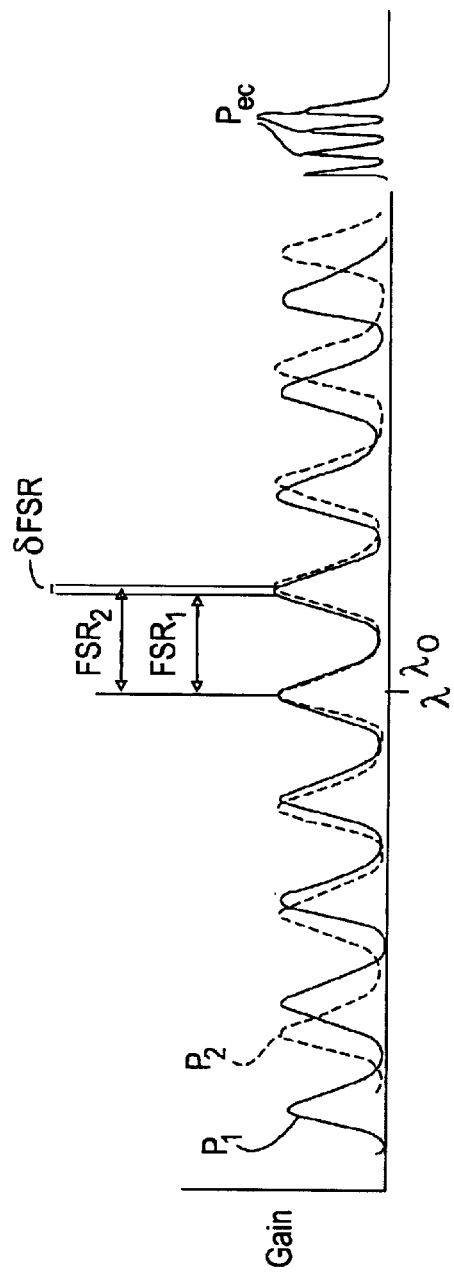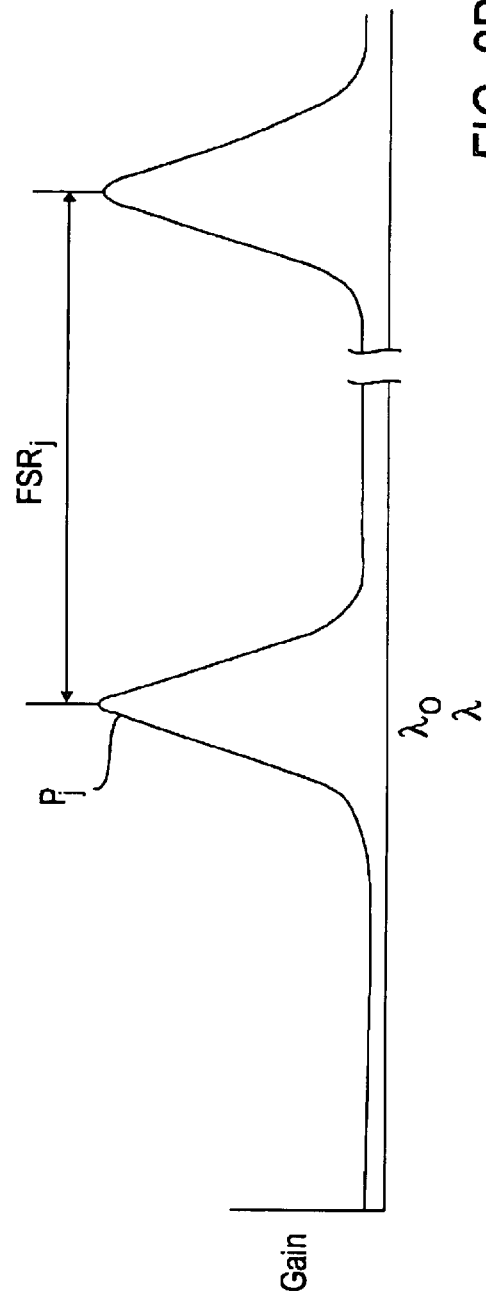

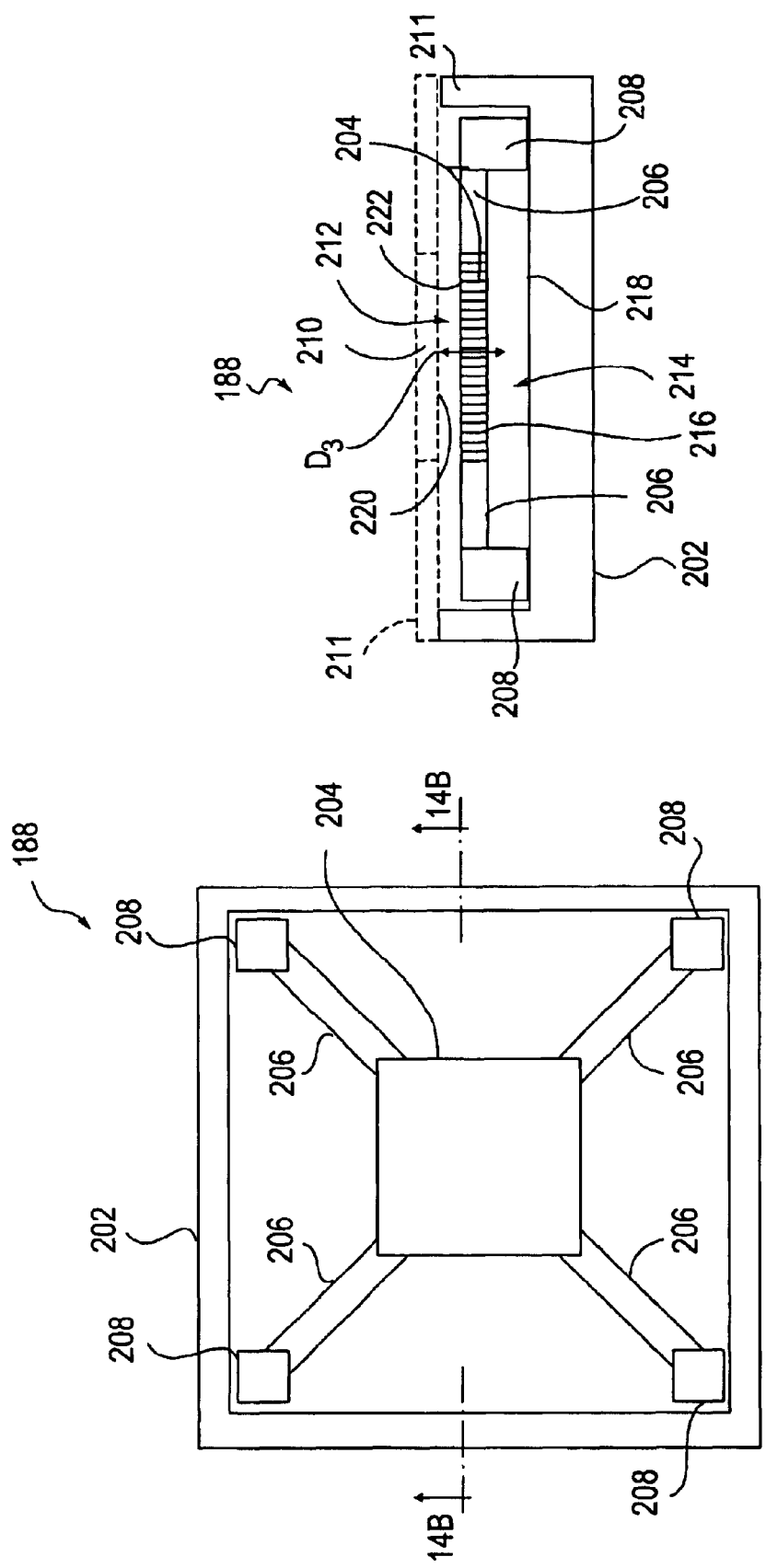

TUNABLE EXTERNAL CAVITY LASER

CROSS REFERENCE TO RELATED APPLICATIONS

This application is a continuation-in-part of U.S. patent application Ser. No. 09/626,526, filed Jul. 27, 2000; and is entitled to the benefits of U.S. Provisional Application No. 60/145,831, filed Jul. 27, 1999, U.S. Provisional Application No. 60/276,645, filed Mar. 16, 2001, U.S. Provisional Application No. 60/276,813, Mar. 16, 2001. U.S. Provisional Application Ser. No. 60/276,643, filed Mar. 16, 2001. U.S. Provisional Application No. 60/276,760, filed Mar. 16, 2001, and U.S. Provisional Application Ser. No. 60/276,646, filed Mar. 16, 2001, the disclosures of which are incorporated herein by reference.

BACKGROUND OF THE INVENTION

The demand for increased bandwidth in fiberoptic telecommunications has driven the development of sophisticated transmitter lasers usable for dense wavelength division multiplexing (DWDM) systems wherein multiple separate data streams propagate concurrently in a single optical fiber. Each data stream is created by the modulated output of a semiconductor laser at a specific channel frequency or wavelength, and the multiple modulated outputs are combined onto the single fiber. The International Telecommunications Union (ITU) presently requires channel separations of approximately 0.4 nanometers, or about 50 GHz, which allows up to 128 channels to be carried by a single fiber within the bandwidth range of currently available fibers and fiber amplifiers. Greater bandwidth requirements will likely result in smaller channel separation in the future.

Telecom DWDM systems have largely been based on distributed feedback (DFB) lasers. DFB lasers are stabilized by a wavelength selective grating that is pre-determined at an early step of manufacture. Unfortunately, statistical variation associated with the manufacture of individual DFB lasers results in a distribution of (wavelength) channel centers. Hence, to meet the demands for operation on the fixed grid of telecom wavelengths (the ITU grid), DFBs have been augmented by external reference etalons and require feedback control loops. Variations in DFB operating temperature permit a range of operating wavelengths enabling servo control; however, conflicting demands for high optical power, long lifetime, and low electrical power dissipation have prevented use in applications that require more than a single channel or a small number of adjacent channels.

Continuously tunable external cavity lasers have been developed to overcome the limitations of individual DFB devices. Many laser tuning mechanisms have been developed to provide external cavity wavelength selection, such as mechanically tuned gratings used in transmission and reflection. External cavity laser tuning must be able to provide a stable, single mode output at a selected wavelength while effectively suppress lasing associated with external cavity modes that are within the gain bandwidth of the cavity. Achieving these goals typically has resulted in increased, size, cost, complexity and sensitivity in tunable external cavity lasers.

There is accordingly a need for an external cavity laser and tuning mechanism therefore that prevents multimode lasing by effective suppression of transmission peaks at wavelengths other than a selected wavelength, that is simple and compact in design, and which is straightforward to implement. The present invention satisfies these needs, as well as others, and overcomes the deficiencies found in the background art.

SUMMARY

The invention is a laser apparatus and method that utilizes dual, tunable elements to provide for wavelength tuning of a light beam. The apparatus of the invention comprises, in general terms, a first tunable wavelength selection element positioned in a light beam and having a first adjustable free spectral range, a second tunable wavelength selection element positioned in the light beam and having a second adjustable free spectral range, with the first and second tunable wavelength selection elements configured to define a joint transmission peak that is adjustable in phase according to tuning of the first and second tunable elements.

More specifically, the first tunable wavelength selection element defines a first plurality of transmission peaks within a selected wavelength range and the second tunable wavelength selection element defines a second plurality of transmission peaks within the selected wavelength range, with the first and second pluralities of transmission peaks configured to jointly define a single joint transmission peak within the selected wavelength range that is adjustable by tuning of the dual tunable elements. Tuning of the tunable wavelength selection elements provides for adjustment of the free spectral ranges of the elements, and hence adjustment of the two sets of transmission peaks, to provide for wavelength selection via a vernier effect. In certain embodiments, a third tunable wavelength selection element having a third free spectral range may be positioned in the light beam.

The methods of the invention comprise, in general terms, providing a first tunable wavelength selection element having a first adjustable free spectral range and a second tunable wavelength selection element having a second adjustable free spectral range, positioning the tunable wavelength selection elements in a light beam, defining a joint free spectral range from the first and second free spectral ranges of the two elements and adjusting the joint free spectral range by tuning the first and second tunable wavelength selection elements. The adjusting of the joint free spectral range may comprise adjusting the phase of a transmission peak defined by the joint free spectral range.

The invention may be embodied in a laser apparatus comprising a gain medium having first and second facets and emitting a light beam from the first facet, and end reflector positioned in the optical path and configured to define an external cavity with the second facet of the gain medium, a first tunable wavelength selection element positioned in the light beam and having a first adjustable free spectral range, a second tunable wavelength selection element positioned in the light beam and having a second adjustable free spectral range, and with the first and second tunable elements configured to define a joint transmission peak that is adjustable in phase according to tuning of the first and second tunable elements.

The joint free spectral range defined by the dual tunable wavelength selection elements may, in certain embodiments, be greater than the gain bandwidth of the gain medium. The gain medium facets may define a tunable wavelength selection element such that the gain medium has a free spectral range, and in certain embodiments the first free spectral range of the first tunable wavelength selection element may approximately equal to a multiple of the gain medium free spectral range. In other embodiments, the second free spectral range of the second tunable wavelength selection element may also be approximately equal to a multiple of the gain medium free spectral range.

By way of example, and not of limitation, the first and second tunable wavelength selection elements may comprise etalon, grating, interference filter and/or other tunable devices, and may operate by thermo-optical, electro-optical, acousto-optical, piezo-optical, mechanical or other tuning mechanism or effect. The gain medium may comprise a diode emitter or a flash-lamp pumpable or electrically pumpable crystal, dye, gas or other gain medium.

In certain embodiments, the first and second tunable elements may each comprise a thermo-optically tunable etalon such as a semiconductor substrate having first and second surfaces, with each surface having one or more thin film dielectric layers deposited thereon. The dielectric layers may comprise, for example, quarter wave dielectric layer pairs. "Thermo-optic" tuning as used herein is means tuning by temperature-induced change in etalon material refractive index, temperature induced change in the physical thickness of an etalon, or both. The etalon materials may, in certain embodiments, have temperature dependent refractive indices as well as coefficients of thermal expansion such that thermo-optic tuning involves simultaneous thermal control of etalon material refractive index as well as thermal control of etalon physical thickness by selective heating or cooling. The free spectral range of each etalon is selected such that thermal control of the etalon over a selected temperature range of the etalon provides tuning, via thermo-optic effect, over a range substantially equal to its free spectral range.

In operation of an external cavity laser using dual tunable etalons in accordance with the invention, the light beam emitted by the gain medium passes through the dual tunable etalons, reflects off the end reflector and returns through the etalons to the gain medium. The free spectral range of each etalon provides a different set of transmission peaks such that only one overlap or alignment of transmission peaks from the two etalons occurs over a selected wavelength range, such as the gain bandwidth of the gain medium. This provides for selection of only one wavelength in the wavelength range and avoids multimode lasing by the external cavity laser. By selective variation of the temperature of the two etalons, the free spectral range of each etalon is varied via thermo-optic effect to allow control of the transmission peaks of the etalons that are aligned, and hence selection of the external cavity laser output wavelength. The finesse of the etalons and the difference between the free spectral ranges of the etalons is selected to prevent multimode lasing at adjacent transmission peaks associated with the etalons. The full width half maximum of the dual etalons is selected to prevent lasing at external cavity modes that are adjacent to the selected wavelength.

The invention provides a tuning system for external cavity lasers and other optical devices that is straightforward to implement, that is simple in design, and which provides fast, effective tuning at selected wavelengths over a wide wavelength range. The use of dual tunable elements that are both tuned to provide wavelength selection allows use of a shorter external laser cavity and effective side mode suppression, and provides a tuning mechanism for external cavity lasers that can be easily adapted or re-configured for different DWDM network requirements. These and other objects and advantages of the invention will be apparent from the detailed description below.

BRIEF DESCRIPTION OF THE DRAWINGS

The invention will be more fully understood by reference to the following drawings, which are for illustrative purposes only.

FIG. 2A is a graphical representation of first and second sets of transmission peaks provided by the first and second tunable elements of the tunable external cavity laser apparatus of FIG. 1.

FIG. 2B is a graphical representation of the joint transmission peak defined by the combined sets of transmission peaks of FIG. 2A.

FIG. 14A is a top plan view of the tunable air gap etalon used in the apparatus of FIG. 13A.

FIG. 14B is a side elevation view of the tunable air gap etalon of FIG. 14A, shown in cross-section through line A—A.

DETAILED DESCRIPTION OF THE INVENTION

Figure 1:
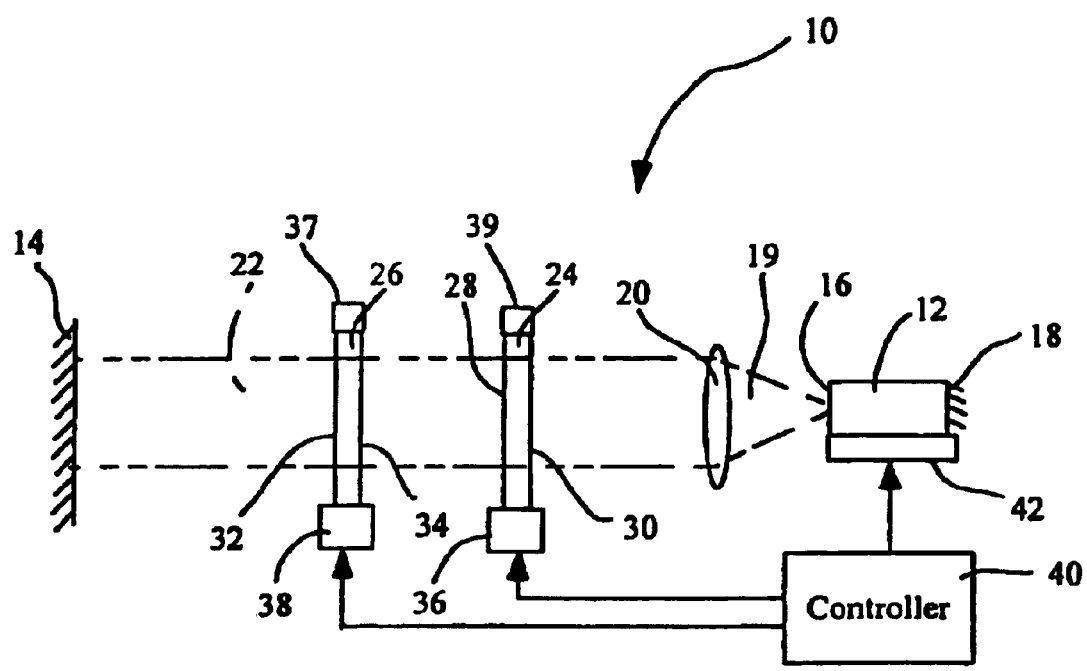
FIG. 1 is a schematic representation of a tunable external cavity laser apparatus in accordance with the invention.

Referring more specifically to the drawings, for illustrative purposes the present invention is embodied in the apparatus shown in FIG. 1 through FIG. 17. It will be appreciated that the apparatus may vary as to configuration and as to details of the parts, and that the method may vary as to details and the order of the acts, without departing from the basic concepts as disclosed herein. The invention is disclosed primarily in terms of use with an external cavity laser. The invention, however, may be used with various types of laser devices and optical systems. It should also be understood that the terminology used herein is for the purpose of describing particular embodiments only, and is not intended to be limiting, since the scope of the present invention will be limited only by the appended claims. The relative sizes of components and distances therebetween as shown in the drawings are in many instances exaggerated for reason of clarity, and should not be considered limiting.

Referring now to FIG. 1, there is shown a laser apparatus 10 in accordance with the invention. The apparatus 10 includes a gain medium 12 and an end or external reflective element 14. Gain medium 12 may comprise a conventional Fabry-Perot diode emitter chip and has an anti-reflection (AR) coated front facet 16 and a reflective or partially reflective rear facet 18. Reflective element 14 may comprise a mirror or other reflective or retroreflective element. An external laser cavity is delineated by rear facet 18 and end mirror 14. Gain medium 12 emits a coherent light beam 19 from front facet 16 that is collimated by lens 20 to define an optical path 22. Conventional output coupler optics (not shown) may be associated with rear facet 18 for coupling output from rear facet into an optical fiber (also not shown).

First and second tunable elements 24, 26 are positioned within the external cavity defined by end mirror 14 and facet 18. Tunable elements 24, 26 are operable together to preferentially feed back light of a selected wavelength to gain medium 12 during operation of the laser apparatus 10. For exemplary purposes, tunable elements 24, 26 are shown in the form of first and second tunable Fabry-Perot etalons, which may comprise parallel plate solid, liquid or gas spaced etalons, and which may be tuned by precise dimensioning of the optical thickness or path length. In other embodiments, etalon 24 and/or etalon 26 may be replaced with a grating, an adjustable thin film interference filter, or other tunable element as described below. First etalon 24 includes faces 28, 30, and has a first free spectral range $FSR_1$ according to the spacing between faces 28, 30 and the refractive index of the material of etalon 24. Second etalon 26 includes faces 32, 34, and has a second free spectral range $FSR_2$ defined by to spacing between faces 32, 34 and the refractive index of the material of etalon 26. Etalons 24, 26 may comprise the same material or different materials with different refractive indices.

Etalons 24, 26 each are tunable by adjustment of their optical thickness, to provide for adjustment or tuning of $FSR_1$ and $FSR_2$, which in turn provides selective wavelength tuning for the laser apparatus 10 as described further below. Tuning of etalons 24, 26 can involve adjustment of the distance between faces 28, 30 and 32, 34 and/or adjustment of the refractive index of the etalon material, and may be carried out using various techniques, including thermo-optic, electro-optic, acousto-optic and piezo-optic tuning to vary refractive index, as well as mechanical angle tuning and/or thermal tuning to vary the spacing of etalon faces. More than one such tuning effect may be applied simultaneously to one or both etalons 24, 26, depending upon the particular embodiment of the invention.

In the embodiment shown in FIG. 1, first and second etalons 24, 26 each are tunable by thermo-optic effect. The term "thermo-optic" tuning means tuning by temperature-induced change in etalon material refractive index, temperature induced change in the physical thickness of an etalon, or both. The etalon materials used in certain embodiments have temperature dependent refractive indices as well as coefficients of thermal expansion such that thermo-optic tuning involves simultaneous thermal control of etalon material refractive index as well as thermal control of etalon physical thickness by selective heating or cooling. The selection of etalon materials for effective thermo-optic tuning is described further below.

To provide thermo-optic tuning, thermal control element 36 is operatively coupled to etalon 24, and a thermal control element 38 is operatively coupled to etalon 26, to provide heating and cooling to etalons via thermal conduction. Thermal control elements 36, 38 in turn are operatively coupled to a controller 40. Controller 40 may comprise a conventional data processor, and provides tuning signals to thermal control elements 36, 38 for thermal adjustment or tuning of etalons according to selectable wavelength information stored in a look-up table or other wavelength selection criteria. Etalons 24, 26 also include includes a temperature monitoring elements 37, 39 operatively coupled to controller 40 that can monitor etalon temperature during laser operation and communicate etalon temperature information to controller 40. Each thermal control element 36, 36 includes a heating element (not shown) that allows adjustment of etalon temperature according to instructions from controller 40.

Thermal control of etalons 24, 26 by thermal control elements 36, 38 may be achieved by conduction, convection or both. In many embodiments, thermal conduction is the dominant pathway for heat flow and temperature adjustment of etalons 24, 26, and convective effects, which may result in unwanted or spurious thermal fluctuation in the etalons 24, 26, should be suppressed. The external cavity laser apparatus 10 may be designed or otherwise configured to allow or compensate for the effects of heat flow by thermal convection, over the operational temperature of the laser. For example, the apparatus 10 may be configured to restrict air flow near etalons 24, 26. In other embodiments etalons 24, 26 may be individually isolated in low conductivity atmospheres or vacuum. Large air paths to structures of dissimilar temperature that are near to etalons 24, 26, and the use of thermally insulating materials for components that are proximate to etalons 24, 26, can also be used to suppress unwanted heat transfer to or from etalons. The design of the apparatus 10 may additionally be configured to provide laminar air or atmosphere flow proximate to etalons, which avoids potentially deleterious thermal effects associated with turbulence.

Thermal control elements 36, 38 allow each etalon 24, 26 to be subject to independent thermal control. Thermal control elements 36, 38 can be used to provide common or parallel heating (both etalons heated or cooled at substantially the same rate of temperature change) as well as differential heating (etalons are heated or cooled at a substantially different rate of temperature change) for wavelength tuning as described below. Thermal control elements 36, 38 may be integrated onto a face or faces each etalon 24, 26 as also described below. Thermal control elements 36, 38 may be associated with heat sinks or reservoirs (not shown) to allow rapid heating and cooling of etalons 24, 26.

In certain embodiments, etalons 24, 26 may be structured and configured such that a single thermal control element or heat sink can simultaneously provide effective tuning of both etalons 24, 26. Thermal sensors or monitors (not shown) may be positioned on etalons 24, 26 or located remotely therefrom, to monitor etalon temperature for controller 40. The etalons 24, 26 may be joined or related by a sub-assembly (not shown) in which etalons 24, 26 are positioned or angled with respect to each other in a manner that avoids unwanted optical coupling between etalons 24, 26. Mounting of etalons 24, 26 with materials of suitable thermal properties can prevent undesired thermal coupling between etalons 24, 26 during tuning.

Facets 16, 18 of gain medium 12 define a Fabry-Perot etalon, and a thermal control element 42 is operatively coupled to gain medium 12 to thermally stabilize the distance between facets 16, 18 and provide for stable output from gain medium 12. Thermal control element 42 is operatively coupled to controller 40. The optical path length of the external laser cavity defined by end mirror 14 and facet 18 may also be subject to adjustment via a thermal control element (not shown) that is operatively coupled to end mirror 14 and controller 42, and thermal control to adjust end mirror 14 and/or gain medium 12 may be carried out according to feedback from an error detection system or systems (not shown) that are operatively coupled to controller 42. Thermal control of external cavity path length is described more fully in U.S. patent application Ser. No. 09/900,443 filed on Jul. 6, 2001, the disclosure of which is incorporated herein by reference.

Etalons 24, 26 provide selective wavelength tuning for the apparatus 10 via a Vernier effect. Referring also to FIG. 2A, first etalon 24 is structured and configured to define a first set or plurality of pass bands, modes or transmission peaks $P_1$ (shown in solid line), the maxima of which are separated by a distance equal to $FSR_1$. Second etalon 26 similarly defines a second set or plurality of pass bands, modes or transmission peaks $P_2$ (shown as a dashed line), with the transmission maxima of peaks $P_2$ separated by a distance equal to $FSR_2$. First and second etalons 24, 26 are structured and configured in many embodiments such that, during laser operation, $FSR_1$ and $FSR_2$ are of similar magnitude, but are unequal.

The difference in free spectral range between $FSR_1$ and $FSR_2$ is achieved by providing a difference in optical path length (including dispersion effects) for each of the etalons 24, 26. Structuring or configuring the etalons 24, 26 to provide different free spectral range can be achieved by various approaches. For example, a small net difference in free spectral range for two etalons may be obtained from a single parallel substrate which, after machining and polishing to attain a desired thickness, is subdivided. One half of the substrate is then subject to an additional operation wherein material is extracted by grinding, polishing or etching to reduce thickness, or wherein an additional substrate material layer or layers are added via conventional material deposition technique to increase thickness. The two halves of the original substrate will thus provide two etalons of slightly differing optical path length and different free spectral ranges. It should be noted that, for two etalons of the same material and the same nominal thickness, a small difference in free spectral range is also realizable by temperature difference or an angle difference between the two etalons, or other difference in tuning effect applied to the etalons.

The difference in the free spectral range, $\delta FSR$, of the two etalons 24, 26 is such that certain or selected peaks $P_1$ and $P_2$ of the two sets of transmission peaks will overlap or align, while the remainder of peaks $P_1$ and $P_2$ are non-overlapping or mis-aligned with respect to each other. In FIG. 2A, a point of overlap or alignment of peaks $P_1$ and $P_2$ is shown at wavelength $\lambda_o$. Additional overlap points for peaks $P_1$ and $P_2$ occur outside the range shown in FIG. 2A. The overlap of peaks $P_1$ and $P_2$ defines or otherwise results in joint transmission peaks $P_j$, shown in FIG. 2B, for the two etalons 24, 26 with joint transmission peaks $P_j$ separated in wavelength by a joint free spectral range or $FSR_j$.

Etalons 24, 26 may be continuously tuned, so that the etalon order $M_1$ and etalon order $M_2$ (of etalons 24, 26 respectively) that comprise the joint transmission peak change frequency at the same rate. This may be achieved, for example where etalons 24, 26 are simultaneously heating or cooling both etalons 24, 26 at substantially the same rate of temperature change. In this case, the wavelength location of joint transmission peak $P_j$ is adjusted within a single joint free spectral range. Differential heating of etalons 24, 26, wherein a different rate of temperature change is applied to each etalon, allows Vernier shifting of the beat between modes such that different peaks $P_1$ and $P_2$ become aligned, to discontinuously adjust the wavelength location of joint transmission peak $P_j$ over a range that is substantially greater than $FSR_j$.

The wavelength of joint transmission peak $P_j$ thus corresponds to a selectable lasing wavelength for the apparatus 10, and is controllable or selectable according to tuning of etalons 24, 26. The various transmission peaks $P_1$ and $P_2$ that are not aligned with each other are suppressed during laser operation. The wavelength of joint transmission peak $P_j$ may, for example, correspond to a particular transmission channel in a communication band. The magnitude of $FSR_j$ (and hence of $\delta FSR$) may be selected such that only a single joint transmission peak $P_j$ occurs within a wavelength range of interest such as the gain bandwidth of gain medium 12 or a selected portion thereof, in order to avoid simultaneous, multimode lasing at multiple joint transmission peaks $P_j$. Alternatively, where more than one joint transmission peak $P_j$ exists within the bandwidth of gain medium 12, one or more suitable filters (not shown) may be used in the apparatus 10 to suppress feedback by etalons 24, 26 to gain medium 12 at multiple wavelengths.

The finesse of etalons 24, 26 and magnitudes of $FSR_1$ and $FSR_2$ are selected to avoid multimode lasing of un-aligned peaks $P_1$ and $P_2$ that are adjacent to a joint transmission peak $P_j$. The finesse of etalons 24, 26 may be equivalent or substantially the same in certain embodiments, and unequal in other embodiments of the invention.

The laser external cavity delineated by end reflector 14 and facet 18 of gain medium 12 defines a plurality of external cavity modes that are shown in FIG. 2A as external cavity mode peaks $P_{EC}$. The external cavity mode peaks $P_{EC}$ extend across the wavelength range of FIG. 2A, and only a portion of the external cavity mode peaks $P_{EC}$ are shown for reason of clarity. The full width half maximum of the joint transmission peak $P_j$ is chosen (according to the configuration of etalons 24, 26) to prevent unwanted lasing at cavity mode peaks $P_{EC}$ that are adjacent to a joint transmission peak $P_j$.

Etalons 24, 26 may be configured such that $FSR_1$ and $FSR_2$ are each approximately equal to the free spectral range (not shown) of the gain medium 12, in order to maintain an approximately commensurate condition with respect to facet reflectance of gain medium 12. Such a condition is not necessary, however, where the reflectivity of facet 18 is sufficiently suppressed by antireflective coating. The absolute thickness of etalons 24, 26 is selected so that the temperature range necessary to tune or adjust the location of joint transmission peak $P_j$ within the joint free spectral range $FSR_j$ can be provided by thermal control elements 36, 38. Etalon thickness also depends on etalon material selection as discussed further below.

The difference in the Vernier pitch provided by etalons 24, 26, i.e., the difference between $FSR_1$ and $FSR_2$ or the magnitude of $\delta FSR$, may be varied according to the level of wavelength selectivity desired, the wavelength range of interest, and the particular use of the apparatus 10. In many embodiments, etalons 24, 26 are structured and configured such that $FSR_1$ will be generally within a few percent of $FSR_2$. Thus, for example, $FSR_1$ may be equal to between approximately 99% and 101% of $FSR_2$ in some embodiments, while in other embodiments $FSR_1$ may be equal to between approximately 98% and 102% of $FSR_2$. In certain embodiments, the difference between the free spectral ranges of etalons 24, 26 may be greater, such that $FSR_1$ is equal to between approximately 95% and 105% of $FSR_2$, and some cases, $FSR_1$ may be equal to between approximately 90% and 110% of $FSR_2$ or more.

The $FSR_1$ and $FSR_2$ (and hence $FSR_j$) of etalons 24, 26 will in many embodiments be chosen to avoid multimode lasing within the gain bandwidth of gain medium 12 or other wavelength range of interest, as noted above. That is, etalons 24, 26 provide only a single joint transmission peak $P_j$ within the wavelength range, such that FSRj is as large or larger than the wavelength range of interest, and provide for suppression of transmission peaks adjacent to the joint transmission peak $P_j$. In certain embodiments, the selected wavelength range may comprise particular communication band such as the "C"-band, with selective tuning of etalons 24, 26 used to position the joint transmission peak Pj at desired wavelengths within the communication band.

The difference between $FSR_1$ and $FSR_2$ of etalons 24, 26 may also be determined according to a number of discrete transmission channels or wavelengths within a selected wavelength range. Thus, $FSR_1$ and $FSR_2$ may be related by $$FSR_1 \approx (M/M \pm N)(FSR_2)$$

wherein M is the total number of tunable wavelengths or transmission channels within a selected wavelength range, and N is a non-integer or integer number that is selectable according to different embodiments of the invention. In other words, $FSR_1$ may be approximately equal to the product of $FSR_2$ and the quotient of the number of tunable wavelengths and the number of tunable wavelengths plus or minus a number N. The number N may, for example, be within the range of between about 0.01 or less, and about 10 or more. In principle, any ration ratio of free spectral ranges can provide a vernier effect. In some embodiments, N may bet within the range of between approximately 0.1 and approximately 5, and in certain embodiments, N may fall within the range of between approximately 1 and approximately 2.

The invention may also utilize "broadband" vernier tuning wherein the free spectral range of one of the etalons 24, 26 defines a plurality of transmission peaks corresponding generally to the selectable wavelengths of a transmission grid, while the other etalon has a free spectral range such that it defines only a single transmission peak within the transmission grid. Tuning of the etalons 24, 26 allows selective alignment of the single transmission peak of one of the etalons with one of the plurality of transmission peaks defined by the other etalon, to allow wavelength selection.

In the operation of the apparatus 10, light beam 19 exits facet 16 of gain medium 12, passes through etalons 24, 26, reflects off end mirror 14 and returns through etalons 24, 26 to gain medium 12. The difference in free spectral range of etalons 24, 26 results in a single, joint transmission peak defined by the etalons 24, 26 as described above, and light at the wavelength of the joint transmission peak is fed back or returned to gain medium 12 from etalons 24, 26 to provide lasing of the apparatus 10 at the joint transmission peak wavelength. Simultaneous, parallel tuning of each etalon 24, 26 results in shifting or tuning the joint transmission peak $P_j$ within its free spectral range $FSR_j$ or mode. Differential tuning of each etalon results in shifting of the Vernier beat between modes or transmission peaks $P_1$ and $P_2$ to provide a wavelength shift over a range that is substantially greater than $FSR_j$. The apparatus 10 thus can provide for rapid shifting in tuning between relatively widely separate wavelengths.

Tuning of the joint transmission peak of etalons 24, 26 during the operation of laser apparatus 10 may be carried out according to a particular set of communication channels, such as the International Telecommunications Union (ITU) communication grid. A wavelength reference (not shown), such as a grid generator or other wavelength reference, may be used in association with the apparatus 10, and may located internally or externally with respect to the external cavity of apparatus 10. DWDM systems, however, are increasingly dynamic or re-configurable in nature, and the operation of tunable external cavity lasers according to a fixed wavelength grid is increasingly less desirable. The laser apparatus 10 of the present invention can provide continuous, selective wavelength tuning over a wide wavelength range in a manner that is independent of a fixed, pre-determined wavelength grid, and thus allows for rapid re-configuration of DWDM systems.

The use of dual thermo-optically tuned etalons 24, 26 for wavelength selection in an external cavity laser eliminates the need for mechanical tuning as is in grating tuned external cavity lasers. The thermo-optic tuning is solid state in nature and allows a more compact implementation than is possible in grating tuned lasers, with faster tuning or response times, better resistance to shock and vibration, and increased mode-coupling efficiency. Simultaneous tuning of dual tunable etalons provides more effective laser tuning than can be achieved by the use of a single tunable etalon together with a static etalon.

The use of two simultaneously tunable etalons in accordance with the invention provides substantial advantages over laser tuning mechanisms based on a single tunable etalon or other single tunable element. An important advantage is simpler etalon manufacture. The use of dual (or more) tunable etalons for wavelength selection allows the reflectivity coatings (discussed further below) to be of simpler construction, and provides a greater tolerance for substrate defects. The simpler coating schemes also are typically thinner than those needed for a single tunable etalon, and thus permit a wider bandwidth of tuning operation.

The use of Vernier tuning with two or more tunable etalons in accordance with the invention has the advantage of allowing thermo-optic tuning over a smaller operating temperature range than is possible using a single tunable etalon. This lower overall operating temperature reduces the undesirable convective effects discussed above, reduces power consumption, and avoids temperature dispersion effects that arise in many etalon materials when the materials are heated or cooled over larger temperature ranges. Such dispersion may arise from varying material thermo-optic coefficients, stress or strain induced by variation of material coefficient of thermal expansion, and liberation of thermally excited free carriers at elevated temperatures. Thermo-optic tuning of a single etalon element, for example, can provide wavelength tuning over only a limited wavelength range due to the large temperature range required, as the high temperatures needed for tuning results in excessive losses due to thermally excited free carriers in the etalon.

Effective thermo-optic tuning requires selection of etalon material or materials that exhibit a good thermo-optic effect, i.e., materials that provides a relatively large change in refractive index with changing temperature. A high refractive index and high temperature sensitivity material will provide a wider tuning range with respect to the available working temperature range for the tunable etalons. High refractive index materials provide effective angle tuning as well. High thermal diffusivity of the etalon material helps suppress thermal gradients and permit more rapid tuning and better temperature control. An appropriate coefficient of thermal expansion, such that heating and cooling of the etalon material provides corresponding increase or decrease in the physical thickness of the etalon, also aids in thermo-optic tuning.

Semiconductor materials, such as Si, Ge and GaAs, exhibit relatively high refractive indices, high temperature sensitivity of refractive index, and high thermal diffusivity, and thus provide good etalon materials for thermo-optically tunable embodiments of the invention. Many microfabrication techniques are available for semiconductor materials, and the use of semiconductor etalon materials also allows integration of thermal control and other electrical functions directly onto the etalons, which provides greater tuning accuracy, reduced power consumption, fewer assembly operations, and more compact implementations. Silicon as an etalon material is noteworthy, with a refractive index of approximately 3.478 and a coefficient of thermal expansion (CTE) of approximately $2.62 \times 10^{-6}/°$ K. at ambient temperatures. Silicon is dispersive and has a group refractive index Ng=3.607. There also exists a great deal of silicon processing technology that allows integration of thermal control elements directly onto or within a silicon etalon, as described further below.

Temperature tuning of a silicon etalon through one free spectral range requires an increase or decrease in etalon optical path length OPL by an amount equal to $\lambda/2$. The optical path length OPL is equal to the product of the refractive index of the etalon material and the physical thickness or distance across the etalon, i.e., OPL=nL where n is the refractive index of the etalon material and L is the physical distance across the etalon. The change in optical path length with respect to temperature can be shown as $$\frac{dOPL}{dT} = n\frac{dL}{dT} + L\frac{dn}{dT}$$

where T is temperature (°K), and $\alpha$=coefficient of thermal expansion (1/°K), and $$\frac{\frac{dOPL}{dT}}{OPL} = \frac{1}{L}\frac{dL}{dT} + \frac{1}{n}\frac{dn}{dT} = \alpha + \frac{1}{n}\frac{dn}{dT}$$

The change in optical path length $\Delta OPL$ can accordingly be shown by $$\Delta OPL = \Delta T\left(\frac{dOPL}{dT}\right) = OPL\left(\alpha + \frac{1}{n}\frac{dn}{dT}\right)\Delta T$$

Silicon has a refractive index at 25° C. of approximately 3.48, and thus $$\alpha + \frac{1}{n}\frac{dn}{dT} = 49.2 \times 10^{-6}$$

At 1500 nanometers, tuning of a silicon etalon of 100 micron thickness across a wavelength range of $\lambda/2=750$ nanometers, $$\Delta OPL = OPL\left(\alpha + \frac{1}{n}\frac{dn}{dT}\right)\Delta T$$

corresponds to $(3.48)(0.0001 \text{ meters})(49.2 \times 10^{-6}/°K)(\Delta T)$, or $\Delta T \approx 43.8°$ K. This in turn corresponds to a temperature range of about 20° C.–64° C., which can easily be provided by commercially available thermal control elements.

Figure 3:
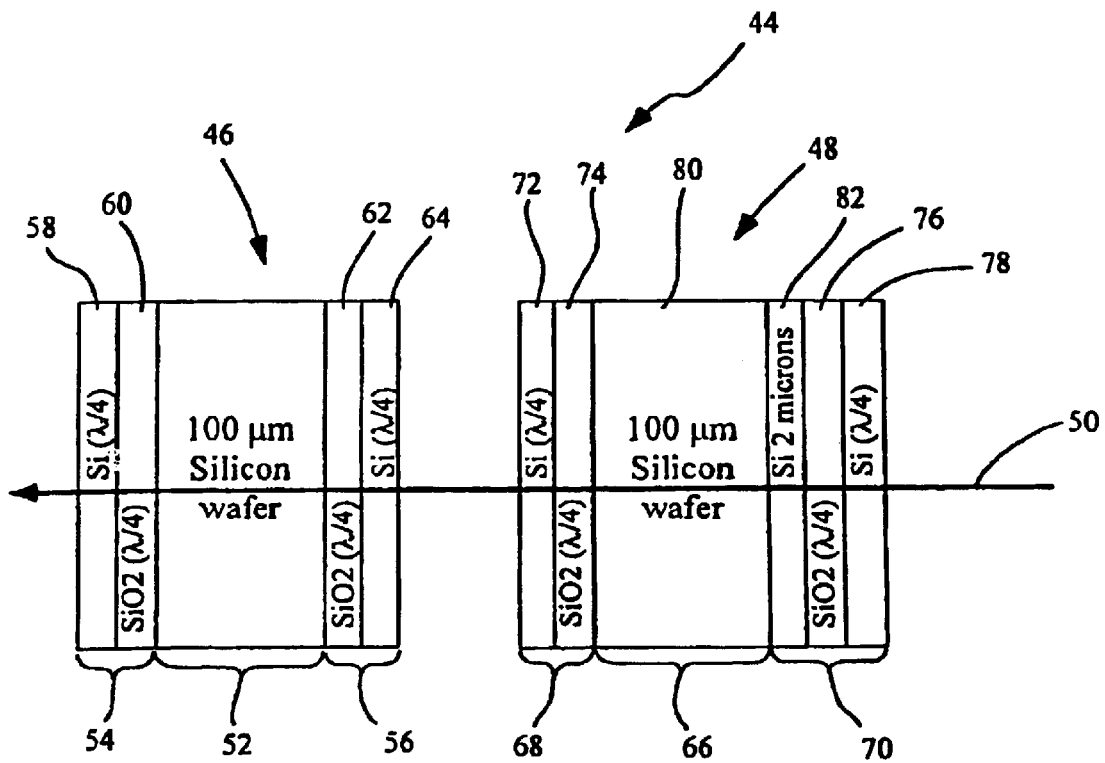
FIG. 3 is a schematic representation of a tunable etalon pair in accordance with the invention, with the etalons shown in cross-section.

Referring now to FIG. 3, a thermo-optically tunable etalon pair 44 is shown that is configured for use in tuning of a telecommunication transmitter external cavity laser. Etalon pair 44 includes a first etalon 46 and a second etalon 48 that are shown positioned in a light beam 50. Etalons 46, 48 are used in association with a laser external cavity (not shown) as described above and shown in FIG. 1. The relative thicknesses of the various layers of etalons 46, 48 as shown in FIG. 3 are exaggerated for clarity and are not necessarily shown to scale.

First etalon 46 includes a 100 micron thick silicon layer 52 located between quarter wave ($\lambda/4$) layer dielectric mirrors 54, 56. Dielectric mirror 54 is shown as including a pair of high refractive index and low refractive index $\lambda/4$ layers 58, 60, with low refractive index layer 60 adjacent silicon layer 52. Dielectric mirror 56 likewise includes a pair of high refractive index and low refractive index $\lambda/4$ layers 62, 64, with low refractive index layer 62 adjacent silicon layer 52. Silicon layer 52 may comprise, for example, a conventional, commercially available 100 micron thick polished silicon wafer, upon which quarter wave layers 58, 60, 62, 64 may be deposited via vapor deposition, sputtering, or other conventional layer forming technique.

In the embodiment shown in FIG. 3, dielectric mirrors 54, 56 each include only a single pair of $\lambda/4$ layers, although in other embodiments a larger number of such quarter wave layers may be used. The low refractive index quarter wave layers 60, 62 comprise Silicon dioxide ($SiO_2$), while the high refractive index layers 58, 64 comprise silicon. Various other high and low refractive index materials are known in the art and may alternatively be used for quarter wave layers 58–64. Silicon has a high refractive index and allows thermo-optically tunable etalons of relatively high finesse to be fabricated with only a single pair of quarter wave layers in each dielectric mirror 54, 56.

Second etalon 48 comprises a 102 micron thick silicon layer 66 located between quarter wave λ/4 layer dielectric mirrors 68, 70. Dielectric mirror 68 includes a high refractive index λ/4 layer 72 and a low refractive index λ/4 layer 74, with low refractive index layer 74 adjacent silicon layer 52. Dielectric mirror 56 also includes a pair of high refractive index and low refractive index λ/4 layers 76, 78, with low refractive index layer 62 adjacent silicon layer 66. In etalon 48, silicon layer 66 is shown as comprising a 100 micron thick silicon wafer 80, together with a two-micron silicon coating 82 deposited thereon to provide 102 micron overall thickness for layer 66. Silicon layer 82, as well as quarter wave layers 72, 74, 76, 78 may be deposited via various conventional layer forming techniques, as noted above. Low refractive index quarter wave layers 74, 76 are shown as comprising $SiO_2$, while the high refractive index layers 72, 78 are shown as silicon, but may be replaced or interchanged with other high and low refractive index materials. A larger number of high and low refractive index quarter wave layers may be used in mirrors 68, 70 than the single layer pairs as shown. As noted above, the use of silicon as a high refractive index quarter wave layer allows relatively high etalon finesse with only a single pair of quarter wave layers.

Figure 4:
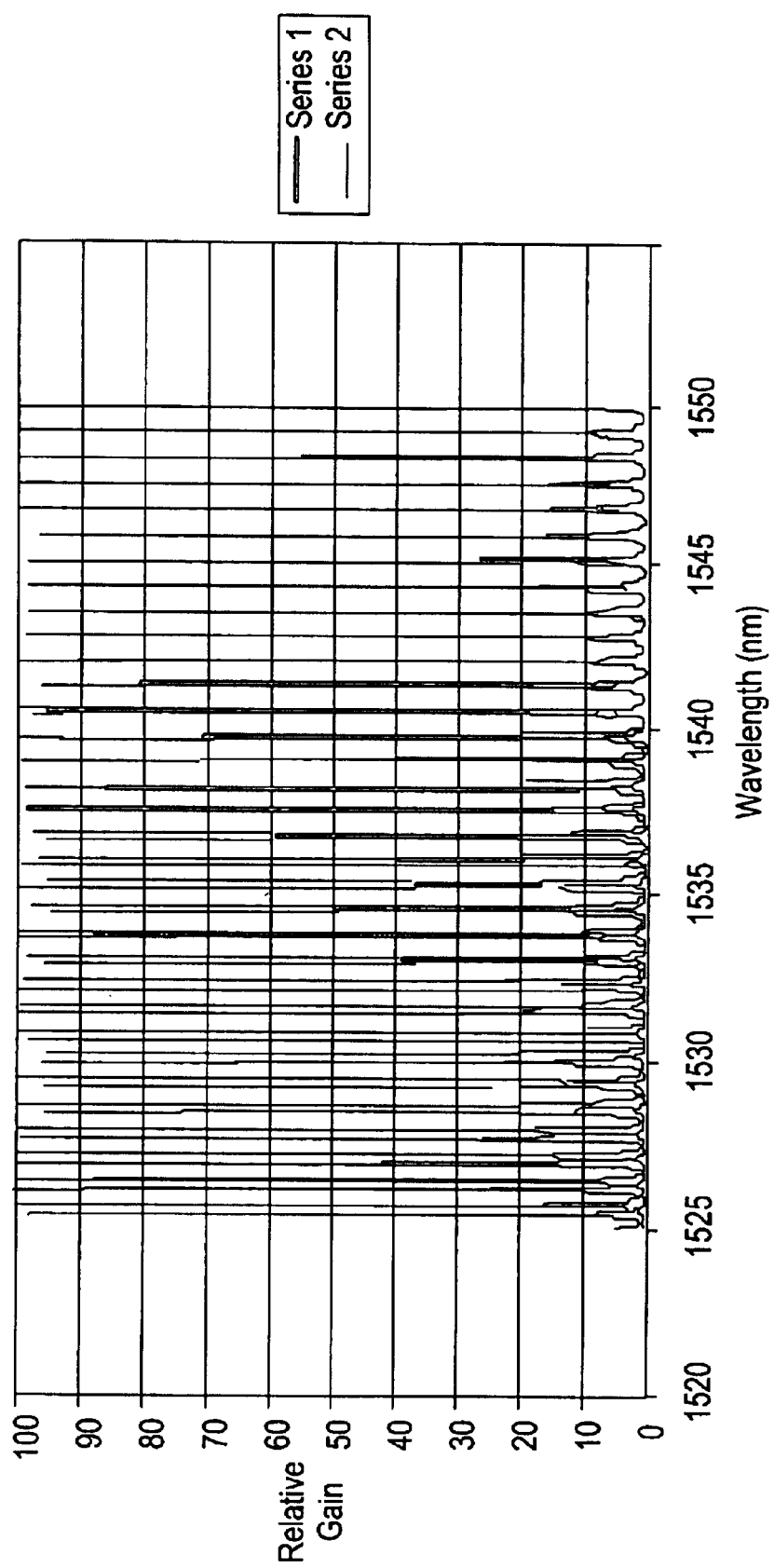
FIG. 4 is a graphical representation of the transmission peaks defined by the etalons of FIG. 3, with the etalons tuned to provide a joint transmission peak at 1550 nm.

The different thickness of the central silicon layers 52, 66 of etalons 46, 48 (100 microns versus 102 microns) provides a 2% difference in the free spectral range of the etalons. Etalons 46, 48 are structured and configured to provide wavelength tuning within the telecommunication band between approximately 1528 nanometers and approximately 1561 nanometers. Referring also to FIG. 4, etalons 46, 48 each define a series of transmission peaks or orders, which are respectively shown as Series 1 and Series 2, with wavelength shown on the horizontal axis, and with relative gain on the vertical axis of the graph of FIG. 4. The free spectral ranges of etalons 46, 48 differ from each other by an amount δFSR, to create a Vernier pitch such that a single point of overlap for the transmission peaks of Series 1 and Series 2 occurs within the wavelength range between about 1525 and about 1575 nanometers (which encompasses the aforementioned telecommunication band). The point of overlap of the peaks of Series 1 and Series 2 is shown at a wavelength of 1550 nanometers. The relationship of the peaks of series 1 and series 2 between 1550 nanometers and 1575 nanometers (not shown in FIG. 4), is approximately the mirror image of the peak relationship between 1525 and 1550 nanometers as shown in FIG. 4.

Etalons 46, 48 thus provide for transmission at a single wavelength within the telecommunication band between 1532 nanometers and 1563.5 nanometers noted above, with the joint free spectral range provided by etalons 46, 48 exceeding this wavelength range. The International Telecommunications Union (ITU) presently require channel separations of approximately 0.4 nanometers, or about 50 GHz, which is easily achieved by thermal tuning of etalons 46, 48. This channel separation allows up to 128 channels to be carried by a single fiber within the bandwidth range of currently available fibers and fiber amplifiers.

In the thermal tuning of etalons 46, 48 across a wide wavelength range, various additional considerations should be made to provide accurate tuning. Silicon has relatively high dispersion in the telecom infrared band noted above, both in refractive index and temperature sensitivity of the refractive index. The properties of silicon, however, are well known, and the dispersion present in temperature tuning of etalons 46, 48 over any particular wavelength range can be mapped or identified, and appropriate tuning adjustments made to compensate for the dispersion. Additionally, the refractive index of deposited silicon layers differs slightly from that of bulk silicon wafers, and in certain embodiments this difference in refractive index difference must be accounted for in etalon design.

Figure 5:
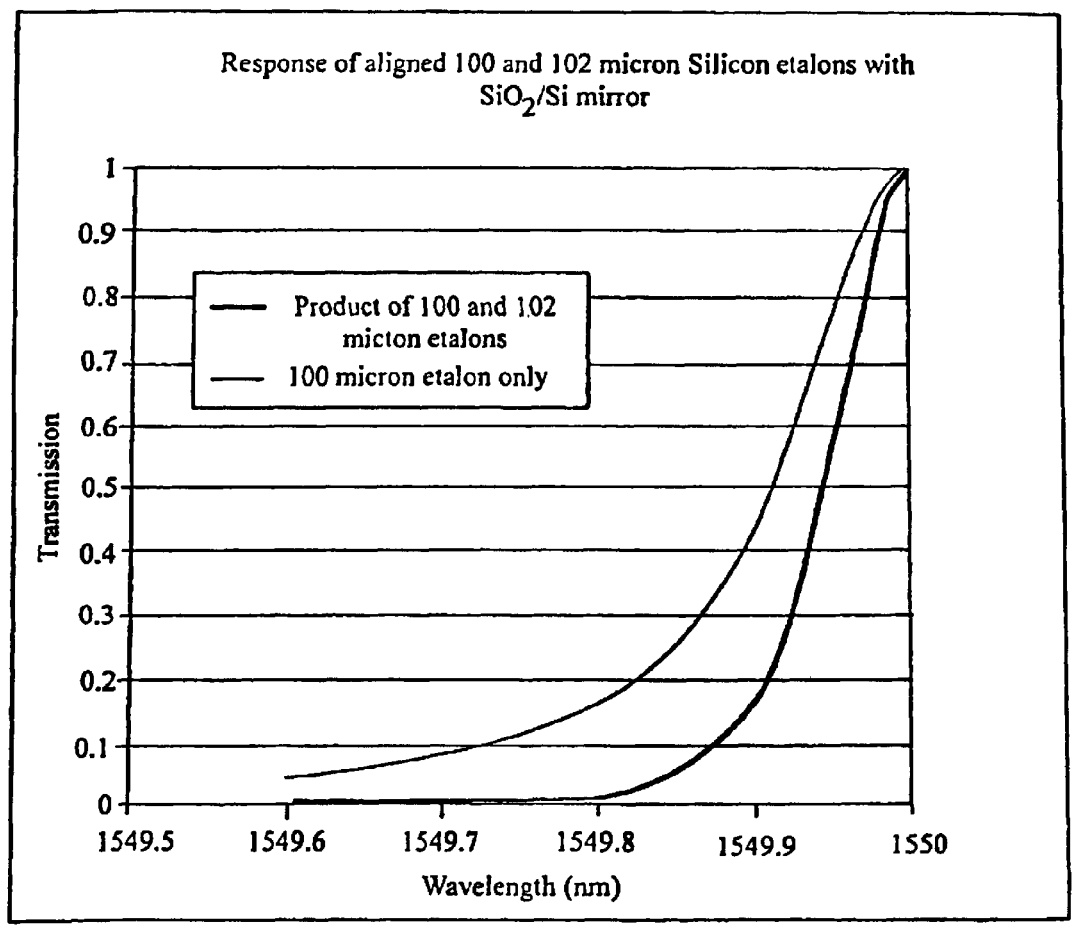
FIG. 5 is a graphical representation of the spectral linewidth of the joint transmission peak of FIG. 4 as provided by the combined effect of the etalons of FIG. 3.

FIG. 5 graphically illustrates the single pass plane wave transmission or response of the aligned etalons 46, 48, to that of etalon 46 alone, with wavelength shown on the horizontal axis and transmission on the vertical axis. As can be seen in FIG. 5, the joint transmission band created at 1550 nanometers by the overlap of the Series 1 and Series 2 peaks of etalons 46, 48 (shown in FIG. 4) has a narrower spectral line width than the corresponding individual transmission band of etalon 46.

Figure 6:
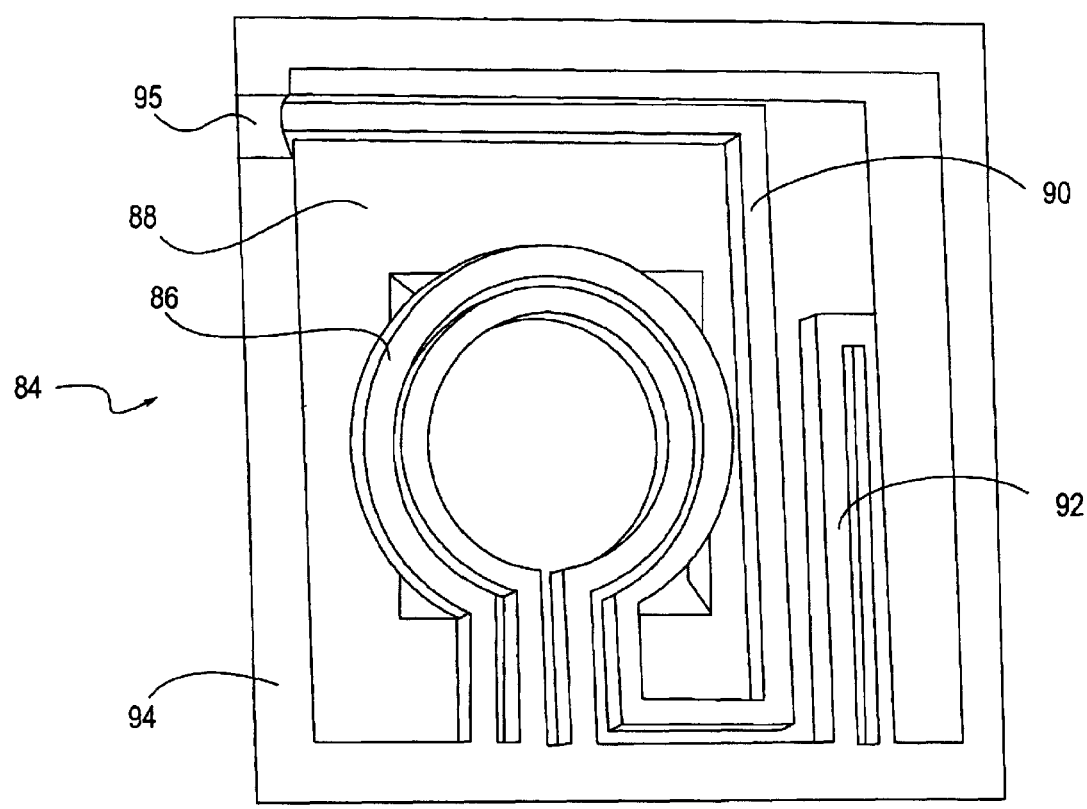
FIG. 6 is a schematic view of a silicon etalon with a thermal control element thereon.

As noted above, microfabrication techniques for silicon can allow integration of tuning functions directly onto the etalon. Referring to FIG. 6, there is shown a silicon etalon 84 with a thermal control element 86 located on face 88 of etalon 84. Thermal control element 86 as show is circular in shape to accommodate passage of a light beam (not shown) through the center of thermal control element 86. Thermal control element 86 comprises a conductive material that heats up upon application of current to provide the temperature change to etalon 84 required for thermo-optic tuning as described above. Conductors 90, 92 electrically connect thermal control element 86 to a current source (not shown). A temperature monitoring device such as a thermistor (not shown) may integrated onto etalon 86 or located remotely from etalon 86.

Thermal control element 86 and conductors 90, 92 may be formed on etalon surface 88 by a variety of photolithographic and material deposition techniques. For example, a photoresist (not shown) may be applied to surface 88, patterned according to the configuration of control element 86 and conductors 90, 92, and developed to remove the exposed photo resist. The conductor material may then be deposited in developed pattern, and the remaining photoresist stripped from surface 88 to provide thermal control element 86 and conductors 90, 92 as shown in FIG. 6. Alternatively, the surface 88 may be etched in a pattern corresponding to thermal control element 86 and conductors 90, 92, and conductor material deposited in the groove to provide a thermal control element 86 and conductors 90, 92 that are recessed with respect to surface 88. In still other embodiments, thermal control element 88 may comprise a transparent conductive layer made of indium-tin oxide (ITO). Diffused resistors and traces of various configurations may be formed directly into the silicon etalon 84 using known techniques.

Etalon 86 may be mounted in a frame 94. Frame 94 may be micro-machined from silicon as well, so that frame 94 and etalon 86 are matched in coefficient of thermal expansion. High thermal diffusivity in frame 94 promotes or enhances symmetry in the temperature across etalon 86 and avoids uneven heating or cooling of etalon 86 during tuning. Frame 94 and etalon 86 may be derived from the same bulk silicon substrate or from different silicon substrates. Frame 94 facilitates the handling and mounting of etalon 86. Frame 94 also provides a convenient location for a temperature probe 95 for monitoring the temperature of etalon frame 94, which serves as a thermal reservoir for thermal control of etalon 86.

Figure 7:
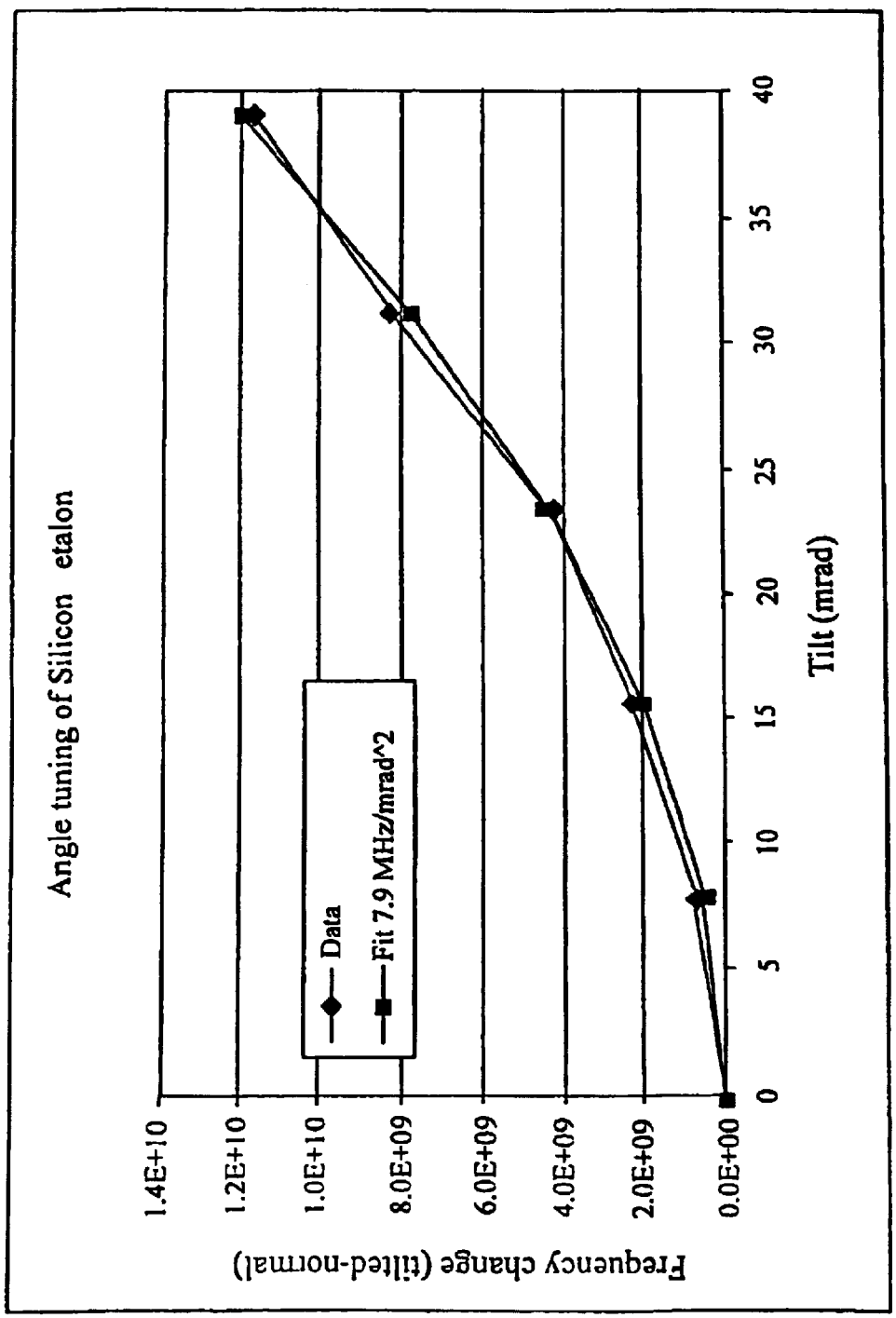
FIG. 7 is a graphical representation of frequency change versus degree of tilt for angle tuning of a silicon etalon in accordance with the invention.

In addition to the thermo-optic tuning described above, wavelength selection with dual tunable etalons may be achieved by mechanical angle tuning as well. Angle tuning involves rotating or tilting etalons with respect to the light beam traveling therethrough, to increase or decrease the phase difference between successive reflections in the etalons, and hence increase or decrease the free spectral range. Referring to FIG. 7, there is graphically shown the effect of tilt (milliradians) versus frequency change (Hertz) for a 50 GHz thick silicon etalon, with the wavelength at zero tilt at approximately 1550 nanometers. Angle tuning of etalons can be achieved using a variety of conventional precision micropositioning or translation devices to provide for precise angular positioning of etalons for wavelength tuning.

Continuous tuning of the dual etalons of FIG. 1, by providing substantially the same rate of angular tuning to each of two etalons simultaneously, allows tuning of the etalons' joint transmission peak within the joint free spectral range defined by the etalons. Differential angle tuning provides a shift in the Vernier beat for tuning over a range greater than the joint free spectral range. The high refractive index of silicon provides a good margin for angle tuning of etalons, and angle tuning of dual silicon etalons provides effective wavelength tuning over a wide wavelength range. Other materials having high refractive index may also be used for angle-tuned etalons. As described above, it is also possible to use angle tuning of etalons in conjunction with thermo-optic tuning, in one or both etalons. Tuning of etalons may additionally, or alternatively be achieved by application of strain to change etalon refractive index, injection of current to the etalon material or application of a potential to etalon surfaces to change etalon refractive index, or any other phenomena or effect that can provide a change in etalon optical path length to allow etalon tuning in accordance with the invention.

Figure 8:
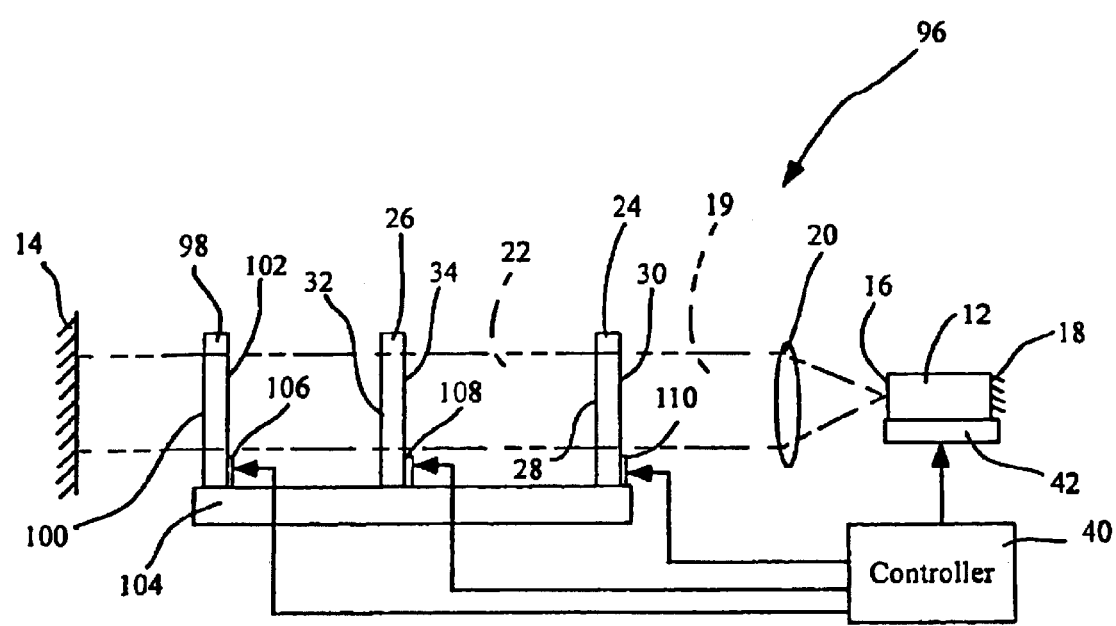
FIG. 8 is a schematic representation of an external cavity laser apparatus in accordance with the invention with three tunable elements.

In order to avoid multimode lasing situations where dual tunable etalons are employed, the etalons may be configured such that only a single joint transmission peak occurs within the gain bandwidth of the gain medium used with the etalons, as described above. This requirement, while easily achievable, introduces design constraints for the two etalons. In certain embodiments, it is desirable to have a third tunable etalon that is usable for control of the wavelength range in which tuning by first and second tunable etalons is carried out. Referring now to FIG. 8, there is shown a laser apparatus 96, wherein like reference numbers are used to denote like parts. The apparatus includes a third tunable etalon 98 that, together with first and second tunable etalons 24, 26, is used to select the output wavelength of the apparatus 10 via a triple vernier effect. Etalon 98 includes faces 100, 102 and, like etalons 24, 26, comprises a material that allows thermo-optic tuning of etalon 98. Like etalons 24, 26, etalon 98 may alternatively, or additionally, be tunable by angle or tilting, strain, electro-optic effect, or other tuning mechanism or effect.

Etalon 98 is configured to suppress one or more joint transmission peaks that are created or defined by the pair of etalons 24, 26. Like etalons 24, 26, etalon 98 is configured to create a plurality of transmission peaks within the gain bandwidth of the cavity. Used in conjunction, the three etalons 24, 26, 98 permit only one joint transmission peak created by the three etalons to occur within the gain bandwidth of the cavity. In certain embodiments, tunable etalon 98 may be replaced by conventional static interference filter, such as a bandpass filter, that allows use of a portion of the gain bandwidth. However, such embodiments using a bandpass filter do not allow selectable use of different portions of the gain bandwidth as provided by the apparatus 96.

In the apparatus 96 of FIG. 8, each of the three tunable etalons 24, 26, 98 is operatively coupled to a common thermal sink or reservoir 104. Etalons 24, 26, 28 each respectively include a thermal control element 106, 108, 110 that is integrated onto the etalon material in the manner described above with respect to FIG. 6. Thermal control elements 106, 108, 110 each are operatively coupled to controller 40, which provides selective wavelength control via selective heating or cooling of etalons 24, 26, 98 via elements 106, 108, 110. Control elements 106, 108, 110 respectively provide for independent temperature control of etalons 24, 26, 98, while reservoir 104, via conduction, allows rapid re-setting of etalons 24, 26, 98 to a base temperature defined by reservoir 104.

Figure 9:
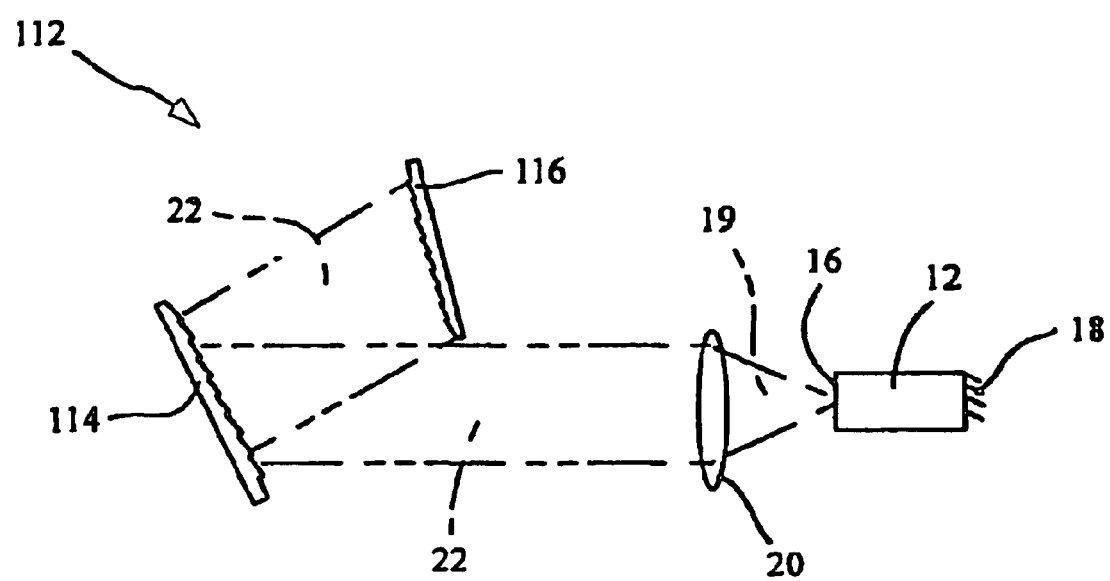
FIG. 9 is a schematic representation of an external cavity laser apparatus in accordance with the invention with dual tunable gratings.

The use of dual tunable elements for Vernier tuning in accordance with the invention may be achieved by various tunable elements other than etalons. Referring to FIG. 9, there is shown a dual grating-tuned laser apparatus 112, with like reference numbers used to denote like parts. The apparatus 112 includes first and second gratings 114, 116 positioned in optical path 22 and operating in reflection. Gratings 114, 116 provide diffraction to light beam 119, with the combined diffractive effects of gratings 114, 116 resulting in a joint transmission peak in the manner described above. The wavelength of the joint transmission peak, and hence the output wavelength of the apparatus 112, is tunable by rotational and/or translational positioning of gratings 114, 116.

Continuous or parallel tuning of gratings 114, 116, wherein gratings 114, 116 are simultaneously subject to substantially the same rates of rotation and/or translation, provides for shifting or tuning of the joint transmission peak of gratings 114, 116 within the joint free spectral range of gratings 114, 116. Differential rotation and/or translation of gratings 114, 116 provides tuning over wavelength ranges substantially larger than the joint free spectral range. A variety of conventional positioning devices and systems are known and used in the art to provide precise rotational and translational tuning of gratings 114, 116 for wavelength tuning of the apparatus 112.

Gratings 114, 116 are shown in FIG. 9 as both operating in reflection. In other embodiments, one or both of gratings 114, 116 may be used in transmission rather than reflection. In embodiments where both gratings 114, 116 are transmissive, an end reflector (not shown) is positioned in the optical path 22 after the gratings.

Figure 10:
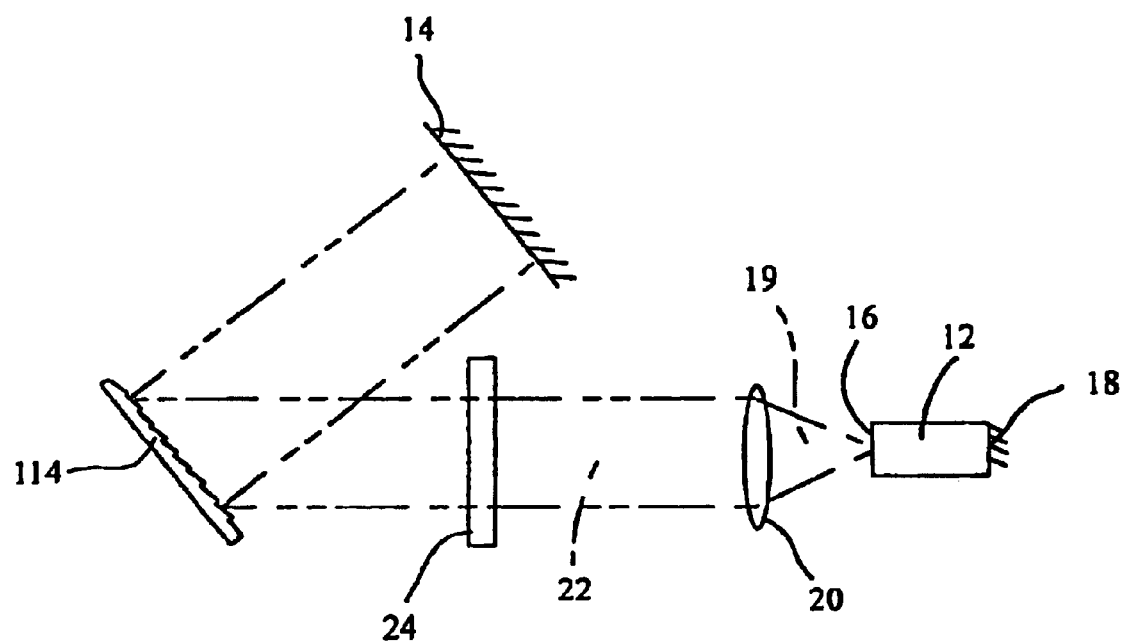
FIG. 10 is a schematic representation of an external cavity laser apparatus in accordance with the invention with grating and etalon tunable elements.

Referring now to FIG. 10, there is shown another laser apparatus 118 in accordance with the invention, with like reference numbers denoting like parts. Dual tunable elements are provided in the apparatus 118 as etalon 24 and grating 114. Etalon 24 is tunable by thermo-optic tuning, angle tuning and/or other tuning effect as described above. Grating 114 may be tunable by rotation, or may be stationary while end reflector 14 is moved in a conventional Littman-Metcalf arrangement to provide for tuning via grating 114. Etalon 24 and grating 114 together define a joint transmission peak as described above, which is tunable within the joint free spectral range defined by etalon 24 and grating 114 via continuous tuning of etalon 24 and grating. Differential tuning of etalon 24 and grating 114 provides Vernier shifting for wavelength tuning over greater ranges, as described above.

Various other tunable wavelength selection elements usable for Vernier tuning are possible. For example, tapered etalons and tapered interference filters that are adjusted by translation with respect to the center of a light beam may also be used with the invention, and are described in U.S.

patent application Ser. No. 09/814,464 filed on Mar. 21, 2001, the disclosure of which is incorporated herein by reference. The use of such other tunable elements and arrangement thereof for Vernier tuning in accordance with the invention is also considered to be within the scope of this disclosure.

Figure 11A:
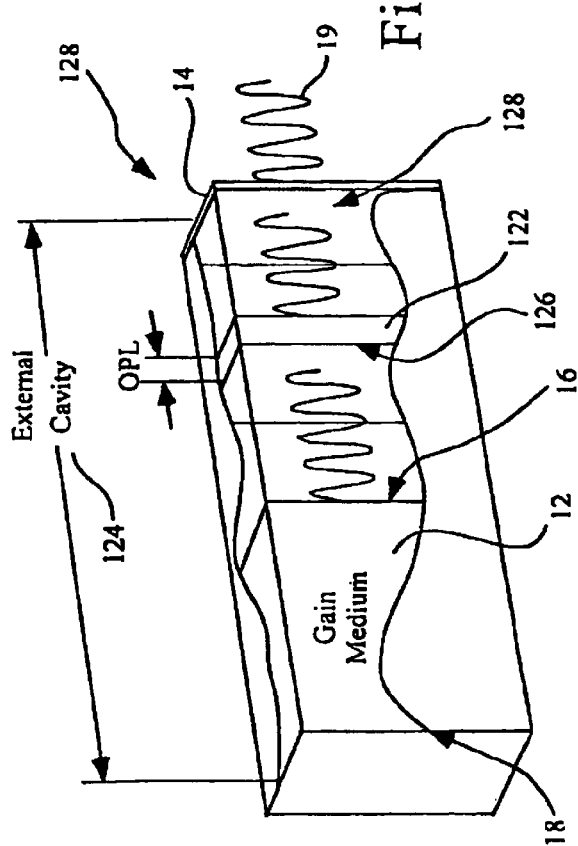
FIG. 11A is a schematic representation of another external cavity laser apparatus in accordance with the invention wherein a tunable etalon and a tunable external cavity operate to provide vernier tuning.

Referring now to FIG. 11A, there is shown another external cavity laser apparatus 120 in accordance with the invention, wherein like reference numbers are used to denote like parts. The apparatus 120 includes a gain medium 12 that emits a beam 19 from an anti-reflection coated facet 16 towards an end mirror 14, with a tunable etalon 122 positioned in beam 19 before end mirror 14. End mirror 14 and facet 18 of gain medium 12 together define an external laser cavity 124 as described above. Etalon 122 is tunable by electro-optical effect to vary its optical path length OPL and hence its free spectral range, and includes a region or layer 126 of electro-optic material. Application of a potential via transparent electrodes (not shown) on the surfaces of layer 126 result in a change in refractive index of layer 126 that accordingly changes the optical path length and free spectral range of etalon 122. End mirror 14 is shown as partially reflective so that a portion of beam 19 exits mirror 14 and may be coupled into an optical fiber (not shown).

In the apparatus 120, the external cavity 124 itself serves as a second tunable element that, together with tunable etalon 122, provides dual tunable elements for laser vernier tuning in accordance with the invention. In other words, end mirror 14 and gain medium facet 18 define an etalon. In this regard, end mirror 14 or the external cavity generally may be tuned mechanically, thermally, electro-optically or by other mechanism to control cavity length. Application of voltage across layer 128 changes the optical path length of the external cavity 124. The combined feedback to gain medium 12 from tunable etalon 122 and external cavity 124 provides tunable wavelength selection for the apparatus 120.

Figure 11B:
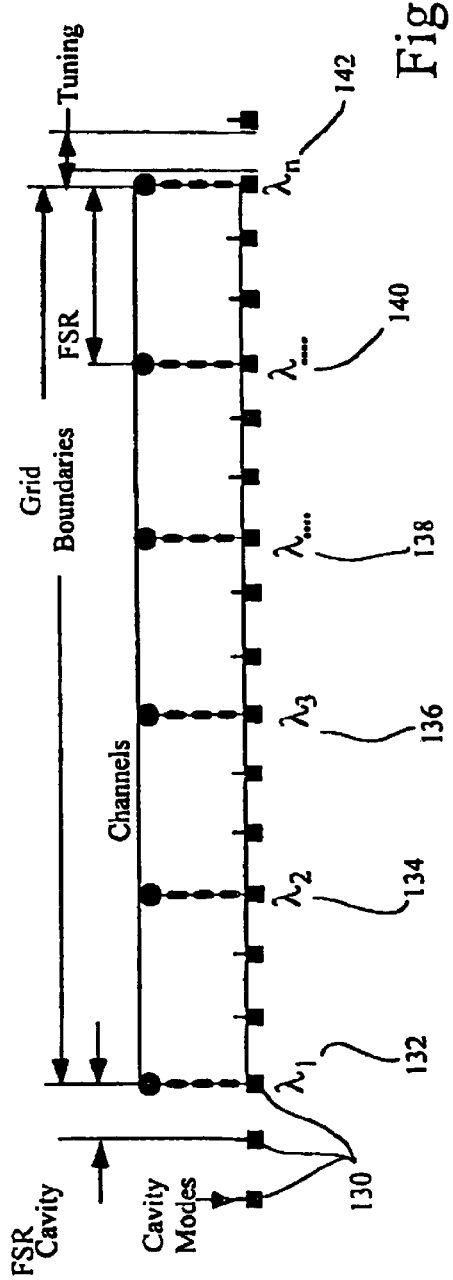
FIG. 11B is a schematic representation of the transmission peaks defined by the tunable etalon and tunable external cavity of FIG. 11A.
Figure 11C:
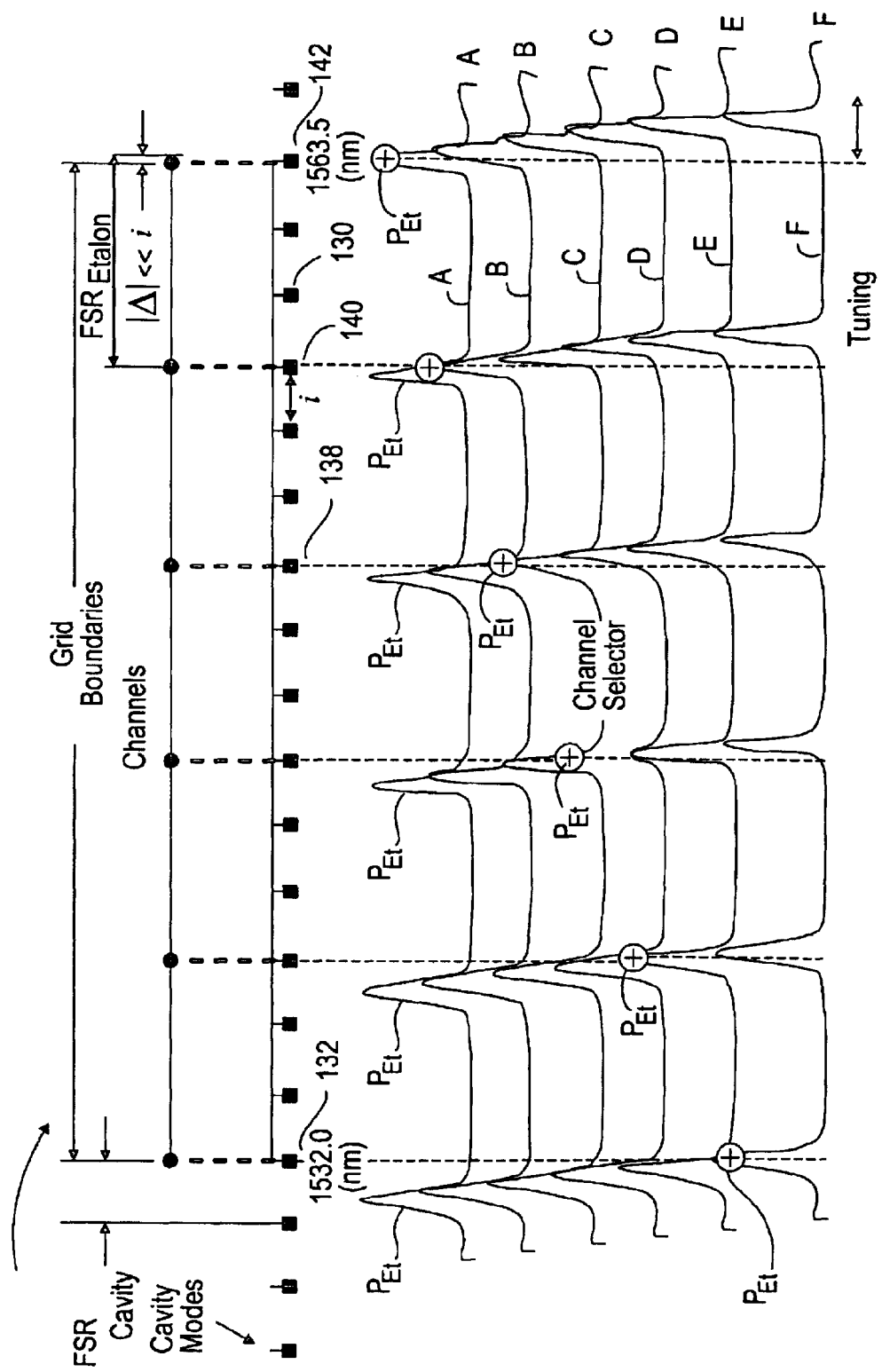
FIG. 11C is a graphical representation of the vernier tuning provided by the tunable etalon and tunable external cavity of FIG. 11A, shown as relative gain versus wavelength.

Referring also to FIG. 11B, the laser external cavity 124 has a free spectral range $FSR_{Cavity}$ that defines a plurality of modes or transmission peaks 130. As shown, every fourth external cavity transmission peak corresponds to or is aligned with a selectable transmission channel 132, 134, 136, 138, 140, 142. Channels 132–142 may correspond to wavelength channels of the ITU grid as described above. The free spectral range $FSR_{Cavity}$ of external cavity 124 and the free spectral range $FSR_{Etalon}$ of etalon can be related by $$K(FSR_{Etalon}) \approx (M/M \pm N)(FSR_{Cavity})$$

wherein K is a rational fraction, M is the total number of tunable wavelengths or transmission channels within a selected wavelength range, and N is a non-integer or integer number that is selectable according to different embodiments of the invention. Referring to FIG. 11C as well, vernier tuning of the external cavity laser 120 is shown for the ITU channel grid wherein K=3 to provide a tuning transition at every third external cavity mode peak for each shift of the vernier beat.

As shown in FIG. 11C, etalon 122 defines a plurality of transmission peaks $P_{Et}$ that are separated by $FSR_{Etalon}$. FIG. 11C shows six different tuning configurations A, B, C, D, E and F for etalon 122 and external cavity 124, which each respectively correspond to wavelength selection at one of channels 132–142. Additional selectable channels (not shown) exist in between the individual channels 132–142. Thus, at tuning adjustment A, a single etalon transmission peak $P_{Et}$ is aligned with the cavity mode peak 130 at channel 142 which, as shown in FIG. 11C, corresponds to a wavelength of 1563.5 nanometers. The other etalon transmission peaks $P_{Et}$ at tuning A are not aligned with any cavity modes 130. At tuning B, an etalon transmission peak $P_{Et}$ is aligned with the cavity mode peak 130 at channel 140. Similarly, at tuning configurations C, D, E and F, etalon transmission peaks $P_{Et}$ are respectively aligned with the cavity mode peaks 130 corresponding to channel 138, 136, 134 and 132. Differential tuning of external cavity 124 and etalon provide for shift of the vernier beat to provide the tunings A–F shown in FIG. 11C. Parallel tuning as described above allows a finer tuning to achieve selection of channels within the range between the individual tunings A–F shown in FIG. 11C.

Figure 12A:
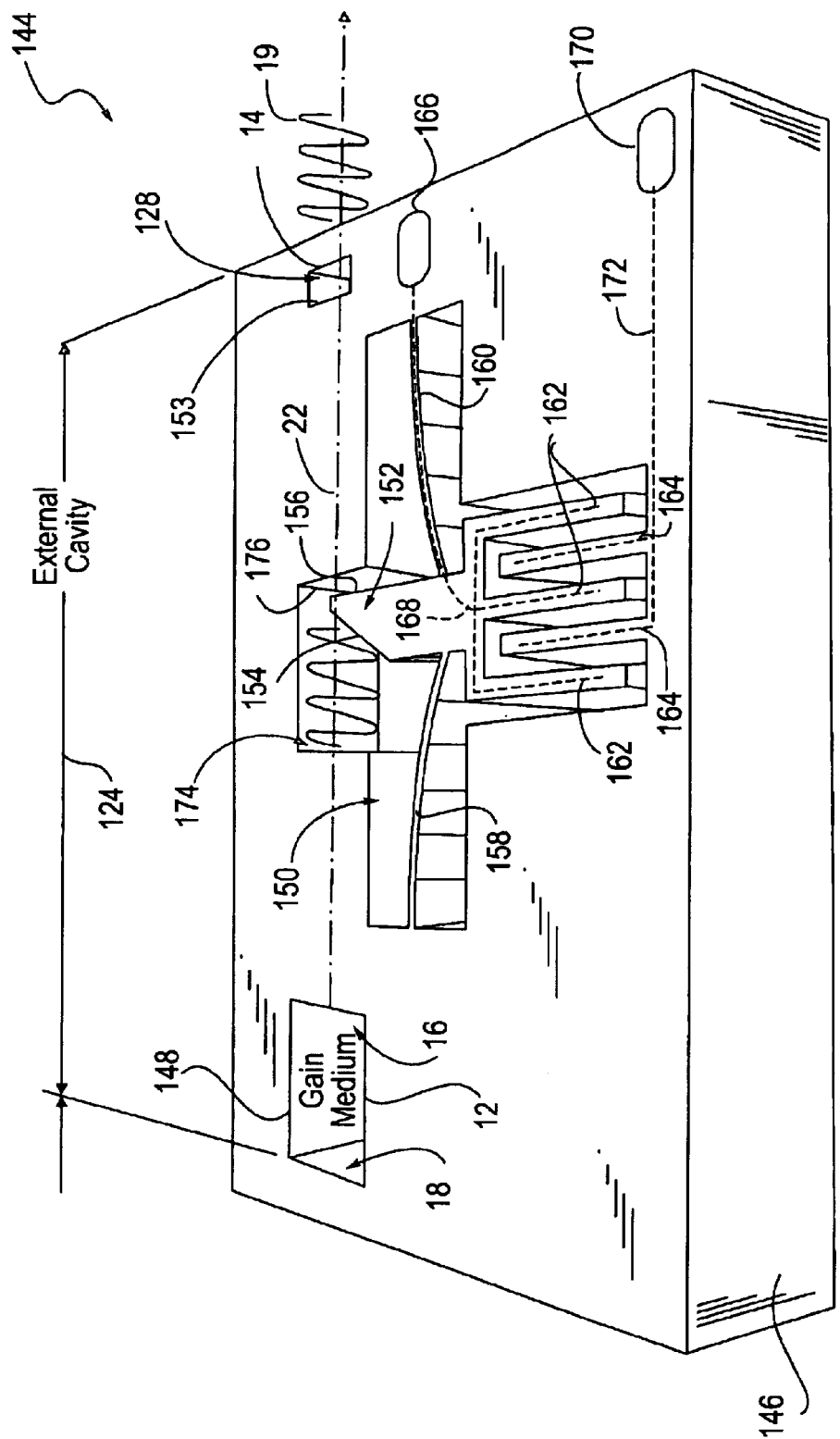
FIG. 12A is a perspective view of another external cavity laser apparatus in accordance with the invention wherein a tunable etalon and tunable external cavity are embodied in a MEMS device.
Figure 12B:
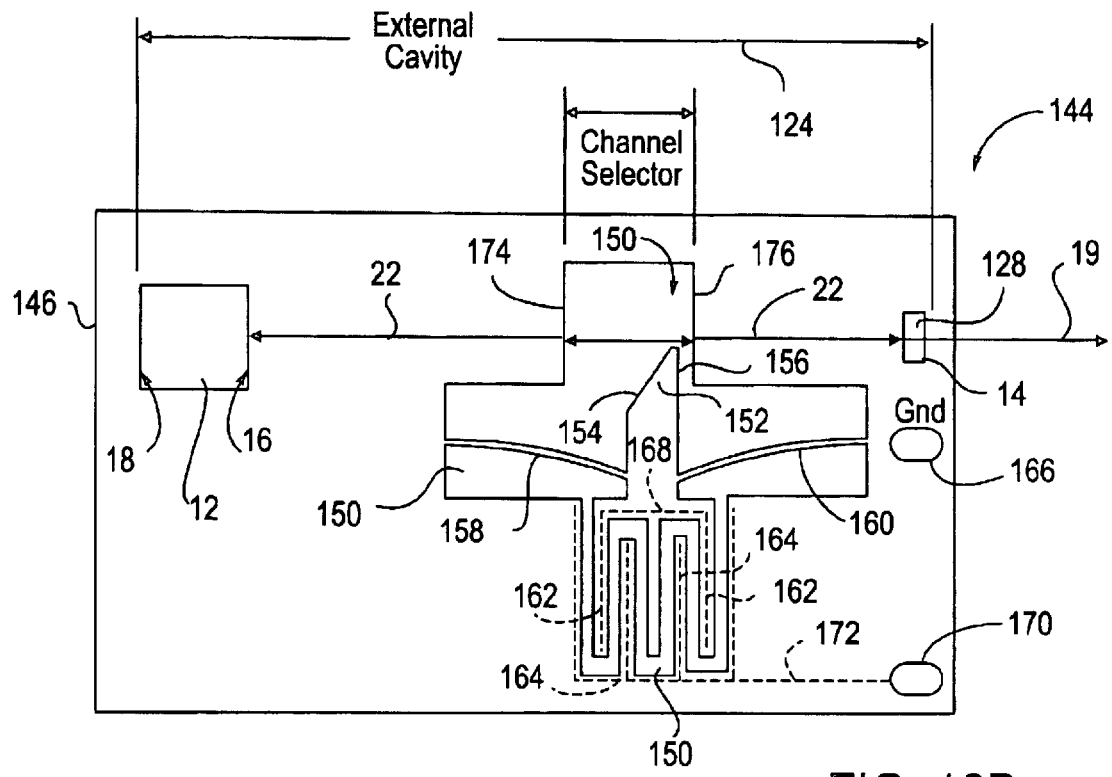
FIG. 12B and FIG. 12C are top plan views of the external cavity laser apparatus of FIG. 12A that illustrate the tuning of the tapered etalon of FIG. 12A.
Figure 12C:
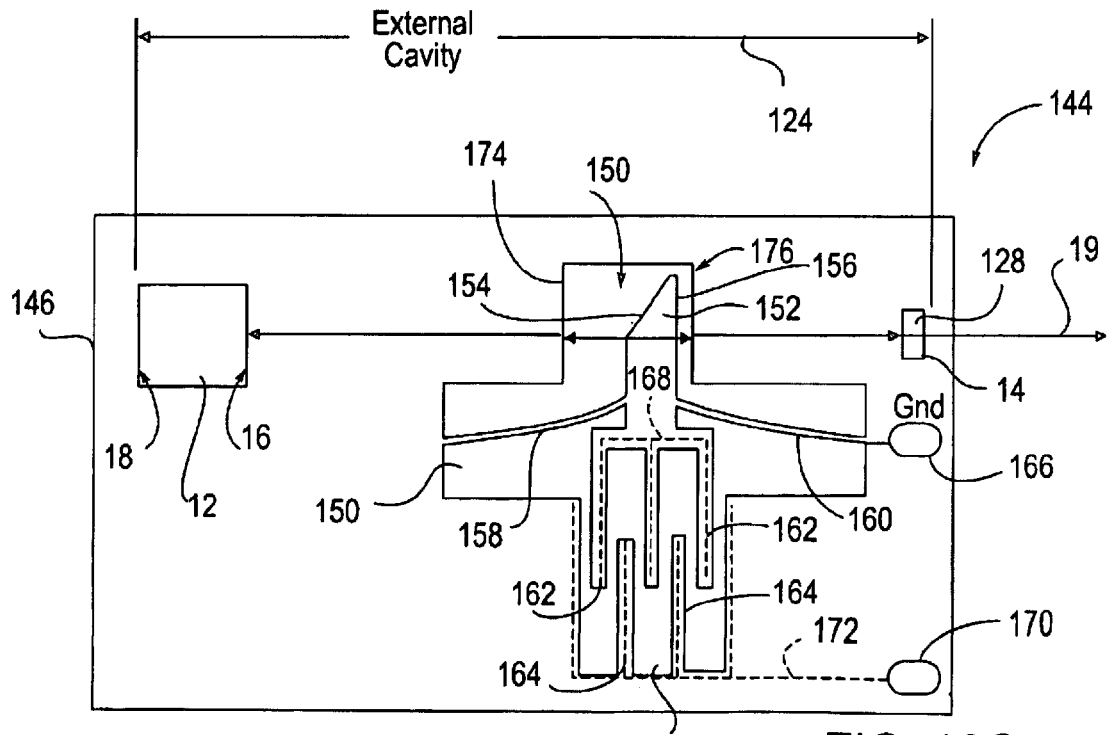

Referring now to FIG. 12A through FIG. 12C, there is shown another embodiment of an external cavity laser apparatus 144, wherein like reference numbers are again used to denote like parts. The apparatus 144 is a microelectromechanical or microelectronically machined (MEMS) device that is fabricated from a monolithic semiconductor substrate 146. Substrate 146 includes a recess 148 that accommodates gain medium 12, a recess 150 that accommodates a tapered etalon 152, and a recess 153 that accommodates an end mirror 14 with an electro-optic element 128 thereon. The material of substrate 146 is transparent throughout the gain bandwidth of gain medium 12, and the beam 19 emitted from facet 18 of gain medium 12 passes through substrate 146.

The tapered or wedge-shaped etalon 152 is used to select between multiple communication channels by changing the thickness of etalon 152 or distance between partially reflective faces 154, 156 of etalon 152 that is presented to optical path 22. This is achieved by translating or driving etalon 152 in a direction that is perpendicular or substantially perpendicular to optical path 22. As the etalon 152 is advanced or translated into optical path 22, the beam 19 traveling along optical path 22 passes through increasingly thicker portions of etalon 152 that support constructive interference between opposing faces 154, 156 at longer wavelength channels. As etalon 152 is withdrawn from optical path 22, the beam 16 will experience increasingly thinner portions of etalon 152 and expose pass bands or transmission peaks to the optical path 22 which support correspondingly shorter wavelength channels.

Etalon 152 is joined to substrate 146 by flexible arms or hinge elements 158, 160. Hinge elements 158, 169 movably support etalon 152 within the recess 150 in substrate 146. Etalon 152 is also joined to a plurality of electrode elements 162. A plurality of electrode elements 164 joined to substrate 146 are interleaved between electrodes 162. Electrodes 162, 164 are accommodated within the recess 150 in substrate 146. An electric contact 166 electrically communicates with electrodes 162 via conductor path 168, and an electric contact 170 is in electrical communication with electrodes 164 via conductor path 172. Varying the voltage across electrodes 162, 164 drives or translates electrodes 162 with respect to electrodes 164. This action correspondingly drives or translates etalon 152 with respect to optical path 22.

In the operation of the apparatus 144, etalon 152 is tuned by translation with respect to optical path 22 to vary the free spectral range, and thus the relationship of transmission peaks, defined by etalon 152. FIG. 12B shows etalon 152 positioned such that the thinnest portion of etalon 152 between faces 154, 156 is positioned within optical path 22, while FIG. 12C illustrates etalon 152 positioned such that a thicker portion of etalon 152 between faces 154, 156 is positioned in optical path 22. As noted above, the positioning of etalon 152 with respect to optical path 22 is achieved by selective application of potential across interleaved electrodes 162, 164 via contacts 166, 170 and conductor paths 168, 172. Hinge elements 158, 160 flex or bend according to the positioning of etalon 152.

The surfaces 174, 176 of recess 150 that are adjacent to etalon 152 may be anti-reflection coated such that the entire tuning effect of etalon 152 is provided by the etalon 152 itself. In other embodiments, surfaces 174, 176 may be partially reflective such that tuning results from the combined feedback of surfaces 154, 156 of etalon 152 and surfaces 174, 176 of recess 150 to effect wavelength selection. During tuning of etalon 152, electro-optic element 128 may also be tuned by selective application of potential thereto to vary the external cavity path optical path length 124. Thus, vernier tuning using the transmission peaks defined by etalon 152 together with the transmission peaks corresponding to the external cavity modes may be achieved in the manner described above.

The MEMS apparatus 144 may be fabricated using various well known semiconductor material processing techniques. Etalon 152, hinges 158, 160 and electrode elements 162, 164 are made of the same material as etalon 152 and substrate 146, and etalon 152, hinges 158, 160 and electrode elements 162, 164 are defined from substrate 146 by micromachining of the semiconductor material of substrate 144. The use of interleaved electrodes for MEMS component actuation is a well known technique and is described in "Introduction to Microelectromechanical Systems Engineering" by Nadim Maluf and published by Artech House, Inc., Norwood Mass. (2000), the disclosure of which is incorporated herein by reference. Gain medium 12 may comprise a separate device that is mounted within recess 148 after the machining thereof in substrate 146.

Figure 13A:
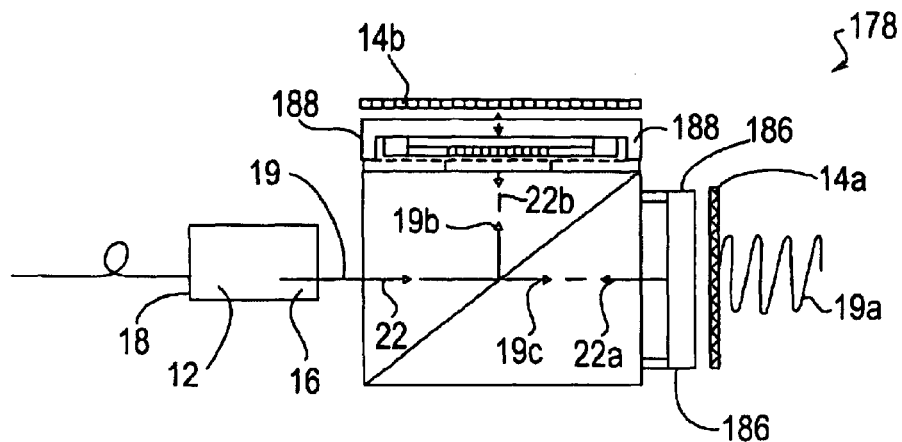
FIG. 13A is a schematic representation of yet another embodiment of an external cavity laser apparatus in accordance with the invention wherein dual tunable elements are utilized in a parallel configuration.

The various external cavity laser apparatus described above utilize dual tuning elements that are positioned or configured in series. It is also possible to tune an external cavity laser in accordance with the invention wherein tuning elements are used in parallel rather than in series. Referring now to FIG. 13A, there is shown an external cavity laser apparatus 178, wherein like reference numbers are used to denote like parts. The apparatus 178 includes a gain medium 12 that emits a beam 19 from anti-reflection coated facet 16 along an optical path 22. A polarizing beam splitter/combiner 180 is positioned in optical path 22 such that a partially reflective layer 182 of beam splitter 180 split beam 19 and pass a light beam 19a to end reflector 14a along path 22a, and reflect a beam 19b towards end reflector 14b along path 22b. End reflector 14a may be partially reflective such that a portion of beam 19a passes therethrough, and may be collected as optical output from the apparatus 178. Rear facet 18 of gain medium may additionally, or alternatively, be partially reflective, such that an optical fiber 184 may be positioned to receive output therefrom.

A first tunable wavelength selection element 186 is positioned in optical path 22a between beam splitter 180 and end mirror 14a, and a second tunable wavelength selection element 188 is positioned in optical path 22b between beam splitter 180 and end mirror 14b. Tunable elements 186, 188 may comprise grating, etalon, interference filter, or other tunable wavelength selection devices as related above, which may be MEMS actuated or tuned according to other mechanism as also described above. In the embodiment shown in FIG. 13A, tunable element 186 is a solid etalon that may be tuned by thermo-optic, electro-optic, mechanical actuation, or other tuning mechanism as described above. The second tunable element 188 is a tunable air gap etalon as described further below. The combined feedback from etalons 186, 188 along optical paths 22a, 22b to beam splitter/combiner 180, and hence from beam splitter/combiner 180 along optical path 22, provide tunable feedback to gain medium 12 that is used to provide wavelength selection.

Figure 13B:
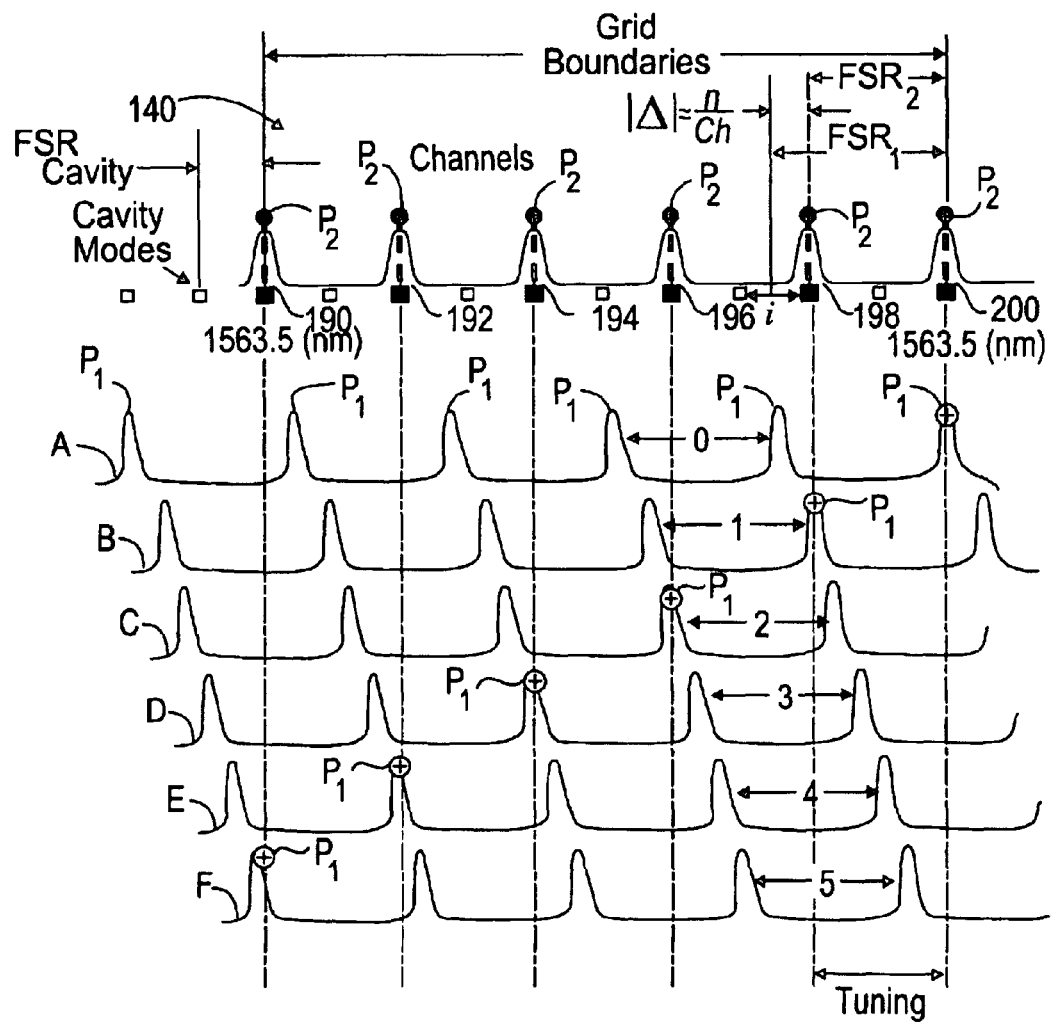
FIG. 13B is a graphical representation of the vernier tuning provided by the external cavity laser apparatus of FIG. 13A, shown as relative gain versus wavelength.

Etalons 186, 188 are operable to provide vernier tuning in accordance with the invention. FIG. 13B graphically illustrates one such form of vernier tuning in which first etalon 186 has a first free spectral range $FSR_1$ that defines a plurality of transmission peaks $P_1$, and wherein second etalon 188 has a second free spectral range $FSR_2$ that defines a plurality of transmission peaks $P_2$. The second free spectral range $FSR_2$ differs in magnitude from the first free spectral range $FSR_1$ by an amount that is selectable according to the configuration of etalons 186, 188. The transmission peaks $P_2$ are shown as centered at selectable wavelength channels 190, 192, 194, 196, 198 and 200, which may correspond to the channels of the ITU grid as noted above. The tuning configurations A, B, C, D, E and F in FIG. 13B correspond to different etalon tuning configurations that each are selective for one of the channel wavelengths 190-200. Thus, for example, at tuning A, etalons 186, 188 are adjusted such that a peak $P_1$ is aligned with a peak $P_2$ to provide transmission at selectable wavelength channel 200 which, in the particular example of FIG. 13B, is shown at 1563.5 nanometers. No other alignment of peaks $P_1$ and $P_2$ occurs within the range of selectable wavelength channels 190–200. Tuning relationship B shows a single alignment of peaks $P_1$ and $P_2$ at wavelength 198. Similarly, tunings C, D, E and F respectively show alignments of peaks $P_1$ and $P_2$ at channel wavelengths 196, 194, 192 and 190.

Differential tuning of etalons 186, 188 provide for shift of the vernier beat to provide the tunings A–F shown in FIG. 13B. Parallel tuning as described above allows a finer tuning to achieve selection of channels within the range between the individual tunings A–F shown in FIG. 13B. In the embodiment shown in FIG. 13A and FIG. 13B, end mirrors 14a, 14b are positioned such that an external cavity mode peak $P_{EC}$ is present at each of the selectable wavelength channels 190–200, and such that one external cavity mode peak $P_{EC}$ is positioned between each of the selectable wavelength channels 190–200. The external cavity, as defined by end mirror 14a and/or end mirror 14b, may be adjusted using the techniques described above to vary the relationship of the external cavity mode peaks $P_{EC}$ with the selectable wavelength channels, if desired.

Referring now to FIG. 14A and FIG. 14B, there is shown a tunable air gap etalon apparatus 188 in accordance with the invention. The etalon apparatus 188 is shown as fabricated from a single bulk semiconductor substrate 202. A solid etalon element 204 is joined to four flexible arms 206, which in turn are joined to pedestals 208. Pedestals 208 are mounted on substrate 202. Substrate 202 also supports a planar electrode portion 210 by supports 211 (FIG. 14B), with electrode portion 210 spaced apart from and substantially parallel with etalon element 204. Etalon element 204 is separated from electrode portion 210 by a first air gap 212, and from substrate 202 by a second air gap 214. Electrode portion 210 and etalon element 204 are configured such that a potential difference can be selectively applied to electrode portion 210 and etalon element 204. Varying this potential difference controls the position of etalon element 204 with respect to electrode element 210, and hence the dimensions of air gaps 212, 214. The surface 216 of etalon element 204 and surface 218 of substrate 202 may be mirrored such that air gap 214 serves as an adjustable air gap etalon capable of providing feedback to gain medium 12 for wavelength selection.

In other embodiments, a conductor (not shown) may be included on surface 218 of substrate 202, to allow for potential adjustment and positional control of etalon element 204 with respect to substrate 202. Additionally, or alternatively, the surfaces 220, 222 of etalon element 204 and electrode portion 210 respectively may be partially mirrored such that air gap 212 serves as an adjustable air gap etalon.

Figure 15:
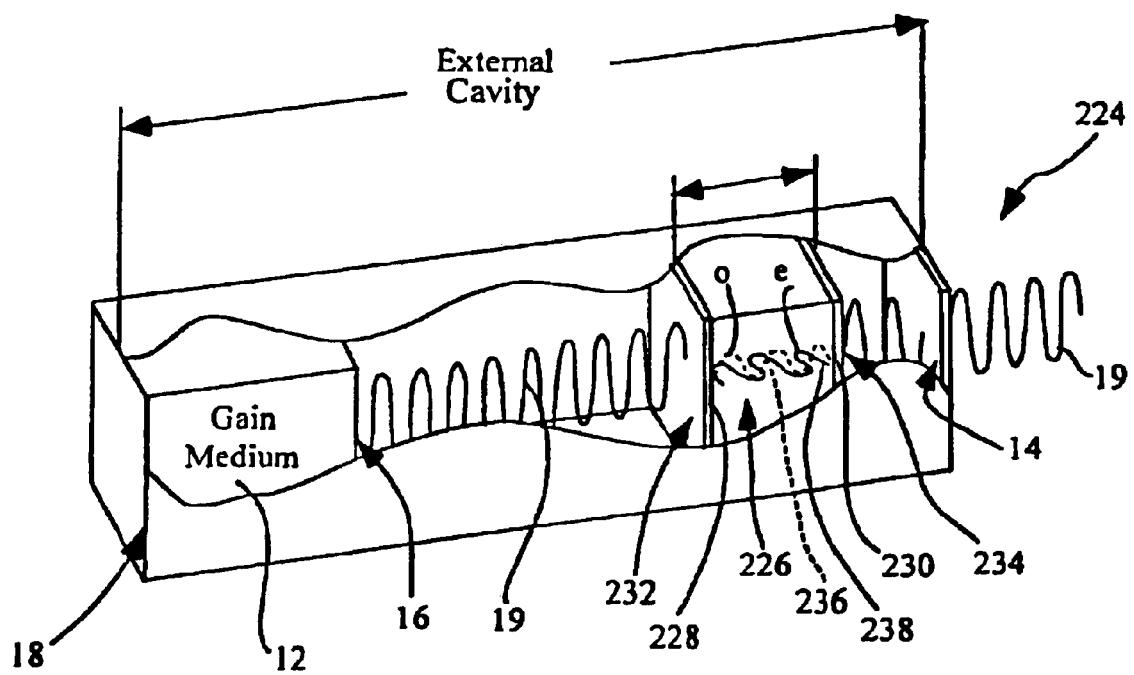
FIG. 15 is a schematic representation of still another embodiment of an external cavity laser apparatus in accordance with the invention wherein a single birefringent etalon provides dual tunable aspects that are utilized in parallel.

The use of tunable elements in a parallel fashion may also be achieved in a single birefringent wavelength selection element, as illustrated more particularly in FIG. 15, wherein still another external cavity laser apparatus 224 in accordance with the invention is shown, with like reference numbers denoting like parts. The apparatus 224 includes a gain medium 12 with a first, antireflection-coated facet 16 and a second reflective or partially reflective facet 18. Facet 16 emits a light beam 19 along optical path 22 towards an end mirror 14 that, together with facet 18, defines an external cavity as described above. End mirror 14 is shown as partially reflective so that a portion of beam 19 may exit end mirror 14 and be collected into an optical fiber (not shown) as output.

A birefringent etalon element 226 is positioned in optical path 22 before end mirror 14. Etalon element 226 may comprise a liquid crystalline material that provides a high level of birefringence. A variety of homogeneous and heterogeneous nematic and smectic liquid crystals may be used. Alignment layers 228, 230, which may comprised rubbed polyimide sheet, are included on the surfaces of etalon 226 as shown, to facilitate alignment of individual liquid crystal molecules (not shown). Transparent electrodes 232, 234 are included adjacent to alignment layers 228, 230, to allow application of a voltage potential across etalon 226.

Birefringent etalon element 226 has different refractive indices along different optical axes. In FIG. 15, a first, ordinary optical axis 236 (dashed line) has a refractive index $n_o$, while a second, extraordinary optical axis 238 (solid line) has a refractive index $n_e$, with $n_e > n_o$. These optical axes are rotated forty-five degrees with respect to the polarization axis of the laser. The polarized light is effectively split into separate beams along the optical axes of the birefringent etalon. The optical thickness of etalon 226 along the first optical axis 236 has a free spectral range $FSR_e$, while the optical thickness of etalon 226 along the second optical axis 238 has a free spectral range $FSR_o$, with $FSR_e$ does not equal $FSR_o$ due to the different refractive indices present in the birefringent etalon material. In other words, the "e"-ray and "o"-ray traveling optical paths 236, 238 respectively experience different optical path lengths across the same physical thickness of etalon 226 due to the difference between refractive indices $n_e$, $n_o$.

Selective application of potential across electrodes 232, 234 and/or tilt adjustment of the orientation of etalon 226 allows independent adjustment of $FSR_e$ and $FSR_o$ in a manner that provides vernier tuning in accordance with the invention. That is, the different free spectral ranges $FSR_e$ and $FSR_o$ result in two sets of transmission peaks $P_e$ and $P_o$ (not shown) that are adjustable to selectively control the location of peak overlaps to provide vernier tuning in the manner described above. Differential tuning of $FSR_e$ and $FSR_o$ to provide shift of the vernier beat, as well as parallel tuning of $FSR_e$ and $FSR_o$ to provide wavelength tuning within a single free spectral range, may be achieved by application of voltage across etalon 226 to vary refractive index $n_e$. Additionally, or alternatively, tilt adjustment or thermal adjustment of etalon 226 to vary $FSR_o$, to provide differential and parallel tuning. Thus, the single birefringent etalon 226 provides the same effect as the use of dual tunable etalons in the embodiments described above.

Figure 16:
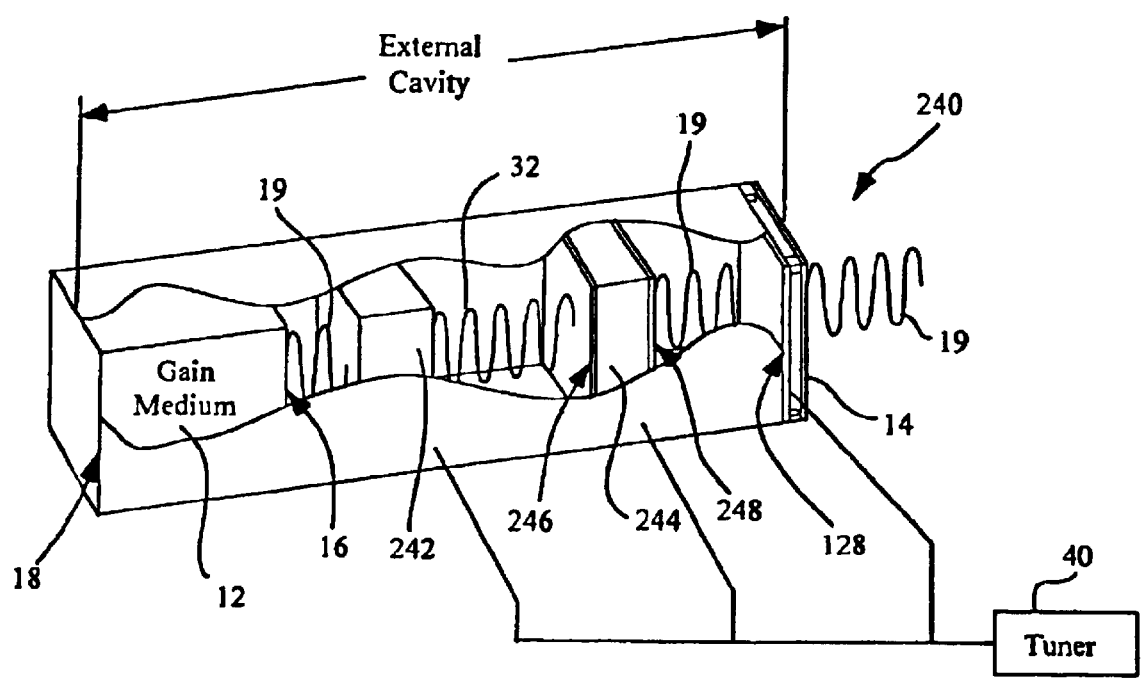
FIG. 16 is a schematic representation of another embodiment of an external cavity laser apparatus in accordance with the invention wherein a tunable external cavity is used to provide reduced finesse requirements for tunable etalons.

Referring now to FIG. 16, there is shown another external cavity laser apparatus 240, wherein like reference numbers denote like parts. The apparatus 240 includes a gain medium 12 that emits a beam 19 from an anti-reflection coated facet 16 along path 22 towards an end mirror 14 that, together with facet 18, defines an external laser cavity 124 as described above. First and second tunable etalons 242, 244 are positioned within external cavity 124 between gain medium 12 and end mirror 14. In this embodiment, etalon 242 comprises a thermo-optic material as described above and is configured for thermo-optic tuning by a thermal control element (not shown) of the type described above. Etalon 242 is operatively coupled to a controller or tuner 40. Second etalon 244 comprises an electro-optic etalon material and has transparent electrodes 246, 248 on surfaces thereof, for selective control of the refractive index (and hence the etalon optical path length) of etalon 244 according to selective application of voltage across etalon 244. Etalon 244 is also operatively coupled to tuner 40.

The external cavity 124 as defined by facet 18 and end reflector 14, provides a third tunable element in the apparatus 240. That is, end mirror 14 and gain medium facet 18 define a tunable etalon, and a portion or layer 128 of electro-optic material with a voltage-dependent refractive index is positioned within cavity 124. Application of voltage across layer 128 by electrodes (not shown) changes the optical path length of the external cavity 124. The combined feedback to gain medium 12 from tunable etalons 242, 244 and tunable external cavity 124 provides tunable wavelength selection for the apparatus 240 via a triple vernier effect as described above regarding the apparatus 96 of FIG. 8.

The use of a tunable external cavity 124 together with dual tunable etalons 242, 244 also reduces the finesse requirements for the transmission peaks of etalons 242, 244 for suppression of transmission peaks associated with unselected wavelengths. This in turn increases the tolerances of etalons 242, 244 and simplifies the nature of the partially reflective coatings on the surfaces of etalons 242, 244, which is desirable in certain embodiments of the invention. Thus, in the apparatus 240, the finesse of the joint transmission peak (not shown) defined by the transmission peak sets of etalons 242, 244 may not be sufficient to provide effective suppression of unselected channel wavelengths during laser operations. However, the additional filtering provided by the triple vernier effect from adjustment of the external cavity 124 via electrooptic element 128 allows for alignment of an external cavity mode (not shown) with a selected channel, and misalignment of cavity modes at other channels, and hence provides for effective vernier tuning with tunable etalons of relatively simple configuration.

Figure 17A:
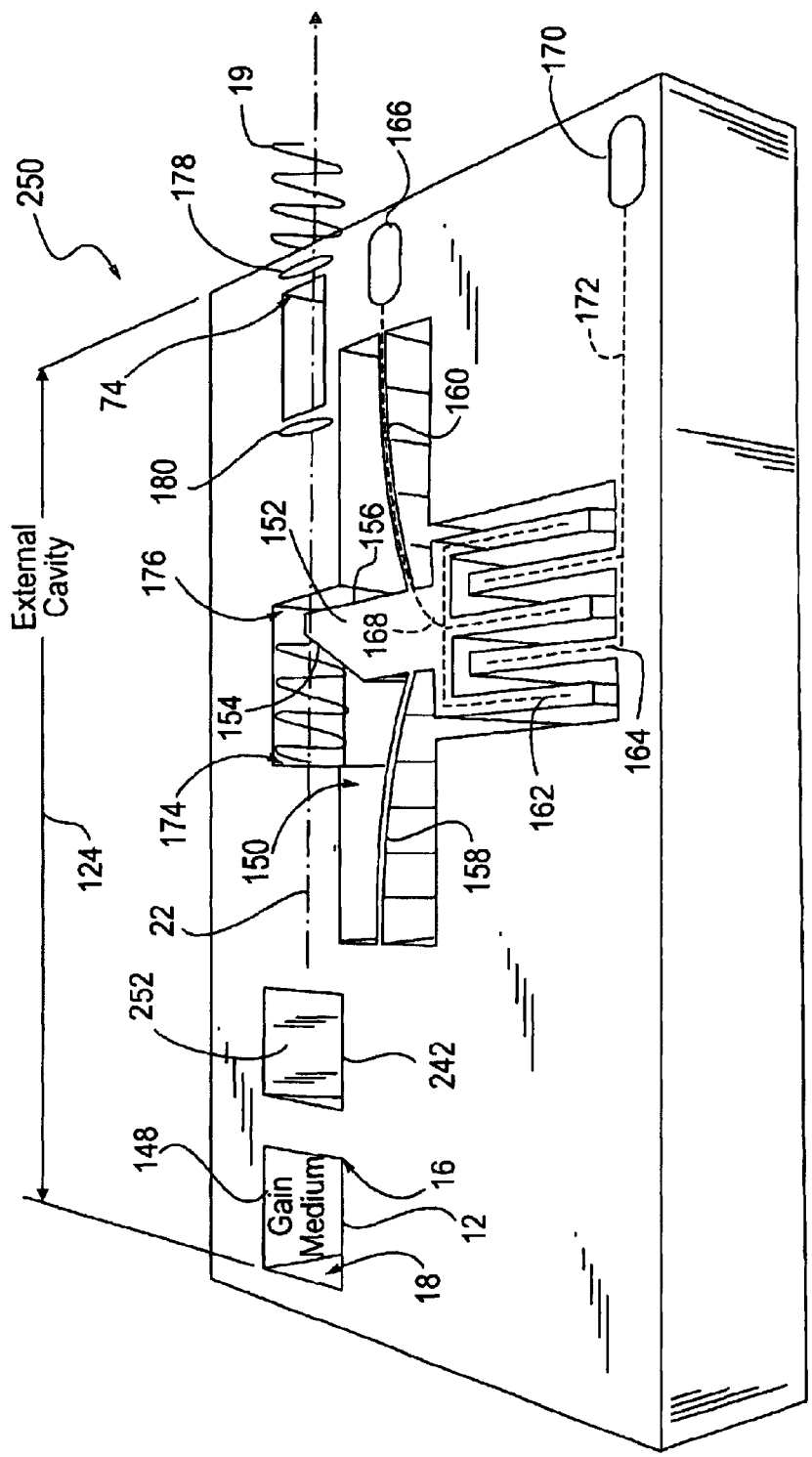
FIG. 17A is a perspective view of another external cavity laser apparatus in accordance with the invention wherein tunable etalons and tunable external cavity are embodied in a MEMS device.
Figure 17B:
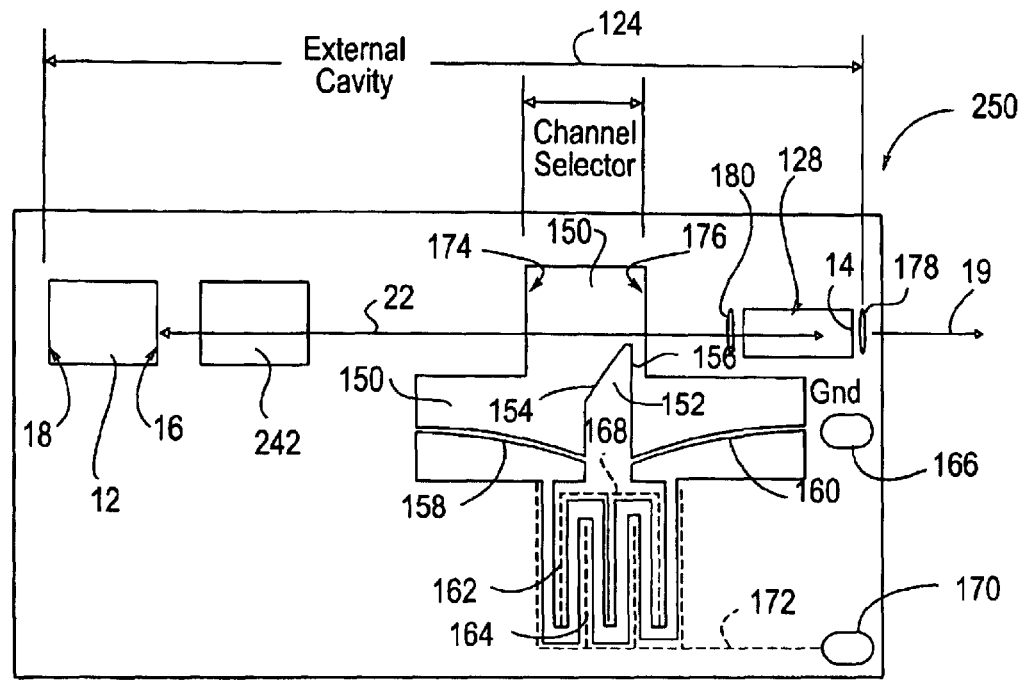
FIG. 17B and FIG. 17C are top plan views of the external cavity laser apparatus of FIG. 12A that illustrate the tuning of the tapered etalon of FIG. 17A.
Figure 17C:
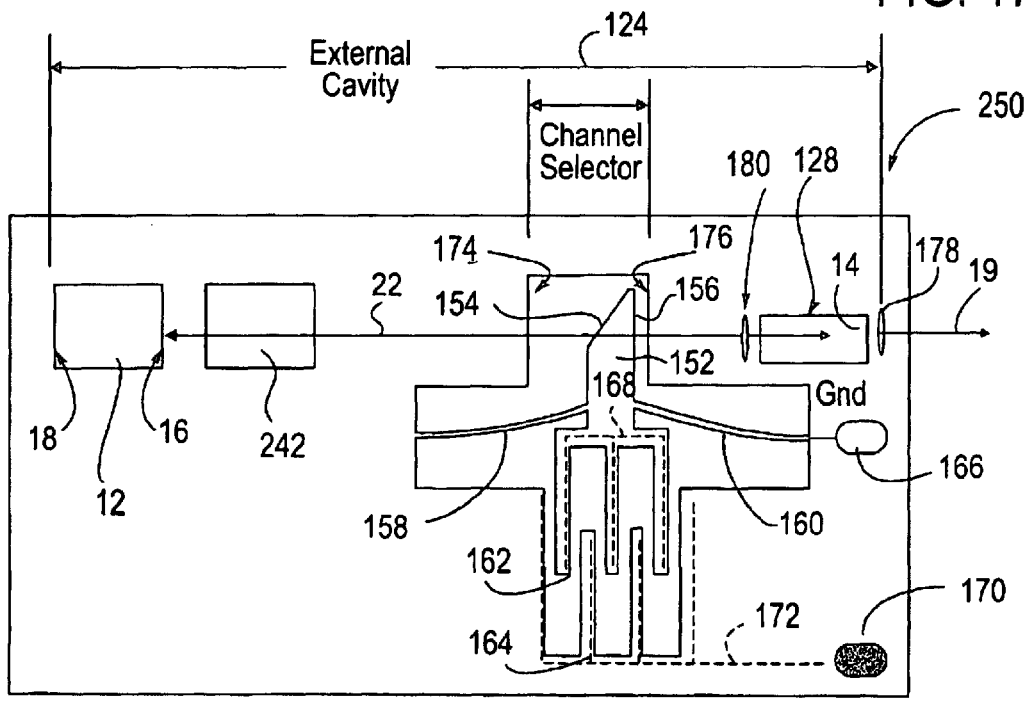

An external cavity laser apparatus with three tunable wavelength selection elements may be embodied in a MEMS device as shown in the apparatus 250 of FIG. 17A through FIG. 17C, wherein like reference numbers are again used to denote like parts. The apparatus 250 is fabricated from a monolithic semiconductor substrate 146. Substrate 146 includes a recess 148 that accommodates gain medium 12, a recess 252 that accommodates a first tunable etalon 242, a recess 150 that accommodates a second tunable etalon 152, and a recess 153 that accommodates an end mirror 14 with an electro-optic element 128 thereon. The material of substrate 146 is transparent throughout the gain bandwidth of gain medium 12, and the beam 19 emitted from facet 18 of gain medium 12 passes through substrate 146.

The etalon 152 is wedged or tapered in shape as described above, and is used to select between multiple communication channels by changing the thickness of etalon 152 or distance between partially reflective faces 154, 156 of etalon 152 that is presented to optical path 22 in the manner described above. Etalon 152 is joined to substrate 146 by flexible arms or hinge elements 158, 160, which movably support etalon 152 within the recess 150 in substrate 146. A plurality of electrode elements 162 joined to etalon 152 interact with a plurality of electrode elements 164 joined to substrate 146 as described above, according to potential introduced via electric contacts 166, 170 and conductors 168 and 172 as described above, such that selective variation of the voltage across electrodes 162, 164 drives or translates electrodes 162 with respect to electrodes 164 and correspondingly drives or translates etalon 152 with respect to optical path 22.

FIG. 17B shows etalon 152 positioned such that the thinnest portion of etalon 152 between faces 154, 156 thereof is positioned within optical path 22, while FIG. 17C illustrates etalon 152 positioned such that a thicker portion of etalon 152 between faces 154, 156 is positioned in optical path 22. The surfaces 174, 176 of recess 150 that are adjacent to etalon 152 may be anti-reflection coated such that the entire tuning effect of etalon 152 is provided by the etalon 152 itself. In other embodiments, surfaces 174, 176 may be partially reflective such that tuning results from the combined feedback of surfaces 154, 156 of etalon 152 and surfaces 174, 176 of recess 150 to effect wavelength selection. During tuning of etalon 152, electro-optic element 128 may also be tuned by selective application of potential thereto via contacts 178, 180 to vary the external cavity path optical path length 124 for triple vernier tuning using the transmission peaks defined by etalons 242 and 152, together with the transmission peaks corresponding to the external cavity modes in the manner described above.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. An optical tuning apparatus, comprising:
   a first tunable wavelength selection element configured to define a first plurality of tunable transmission peaks separated by a first adjustable free spectral range, the first plurality of tunable transmission peaks within a gain bandwidth of a gain medium optically couplable to the optical tuning apparatus;
   a second tunable wavelength selection element configured to define a second plurality of tunable transmission peaks separated by a second adjustable free spectral range, the second plurality of tunable transmission peaks within the gain bandwidth of the gain medium; and
   a controller, operatively coupled to each of the first and second tunable wavelength selection elements, to adjust the first and second free spectral ranges to produce at least one tunable joint transmission peak, wherein each of said at least one tunable joint transmission peak comprises a respective pair of transmission peaks, one from each of the first and second plurality of tunable transmission peaks, that are aligned, and said at least one tunable transmission peak is tuned using a Vernier tuning effect.

2. The apparatus of claim 1, wherein said at least one joint transmission peak is adjustable according to tuning of said first and second tunable wavelength selection elements.

3. The apparatus of claim 1, wherein said first and second tunable wavelength selection elements comprise at least one etalon.

4. The apparatus of claim 1, wherein said first and second tunable wavelength selection elements comprise at least one grating.

5. The optical tuning apparatus of claim 1, further comprising a third tunable wavelength selection element configured to define a tunable pass band.

6. The optical tuning apparatus of claim 1, wherein the first free spectral range ($FSR_1$) is related to the second free spectral range ($FSR_2$) by the equation:

$$FSR_1 \approx (M/M+N)(FSR_2)$$

wherein M is the total number of tunable wavelengths within a selected wavelength range, and N is a non-integer or integer number that is selectable.

7. The optical timing apparatus of claim 1, wherein each of the first and second adjustable free spectral ranges are greater that a wavelength channel spacing in a communication grid to which the apparatus may be tuned.

8. The optical tuning apparatus of claim 1, wherein the apparatus enables continuous, selective wavelength tuning over a wide wavelength range in a manner that is independent of a fixed, pre-determined wavelength grid.

9. The laser apparatus of claim 1, wherein the apparatus enables continuous, selective wavelength tuning over a wide wavelength range in a manner that is independent of a fixed, pre-determined wavelength grid.

10. The apparatus of claim 1, wherein said first and second tunable wavelength selection elements comprise first and second etalons.

11. The apparatus of claim 10, wherein at least one of said first and second etalons is electro-optically tunable.

12. The apparatus of claim 10, wherein at least one of said first and second etalons is angle tuned.

13. The apparatus of claim 10, wherein at least one of said etalons includes first and second surfaces, each said surface having at least one quarter wave dielectric pair layer thereon.

14. The apparatus of claim 10, wherein at least one of said etalons comprises a semiconductor material.

15. The apparatus of claim 14, wherein said etalon includes a thermal control element integrated thereon.

16. The apparatus of claim 10, wherein at least one of said first and second etalons is thermo-optically tunable.

17. The apparatus of claim 16, wherein said controller comprises a thermal controller.

18. The apparatus of claim 16, wherein said etalon is operatively coupled to a thermal reservoir.

19. A laser apparatus, comprising
   a base;
   a gain medium, operatively coupled to the base, to emit a light beam in response to an electric input;
   a first tunable wavelength selection element operatively coupled to the base and positioned in the light beam, configured to define a first plurality of tunable transmission peaks having a first adjustable free spectral range, the first plurality of tunable transmission peaks within a gain bandwidth of the gain medium;
   a second tunable wavelength selection element operatively coupled to the base and positioned in the light beam, configured to define a second plurality of tunable transmission peaks having a second adjustable free spectral range, the second plurality of tunable transmission peaks within the gain bandwidth of the gain medium; and a controller, operatively coupled to each of the first and second tunable wavelength selection elements, to tune a wavelength of an optical output produced by the apparatus by concurrently adjusting the first and second free spectral ranges of the first and second tunable wavelength selection elements to define a single joint transmission peak within a selectable wavelength range and adjustable in phase according to tuning of said first and second tunable wavelength selections elements.

20. The apparatus of claim 19, wherein said first and second tunable wavelength selection elements comprise at least one etalon.

21. The apparatus of claim 19, wherein said first and second tunable wavelength selection elements comprise at least one grating.

22. The laser apparatus of claim 19, further comprising a third tunable wavelength selection element operatively coupled to the base and positioned in the light beam, configured to define a tunable pass band.

23. The laser apparatus of claim 19, wherein the fist free spectral range ($FSR_1$) is related to the second free spectral range ($FSR_2$) by the equation:

$$FSR_1 \approx (M/M+N)(FSR_2)$$

wherein M is the total number of tunable wavelengths within a selected wavelength range, and N is a non-integer or integer number that is selectable.

24. The laser apparatus of claim 19, wherein each of the first and second adjustable free spectral ranges are greater that a wavelength channel spacing in a communication grid to which the apparatus may be tuned.

25. The apparatus of claim 19, wherein the gain medium comprises a laser diode having first and second facets defining an internal cavity having a free spectral range and emitting the light beam from the first facet.

26. The apparatus of claim 25, further comprising a reflective element positioned in said light beam after the first and second tunable wavelength selection elements, the reflective element and the second facet of the gain medium defining an external cavity laser.

27. The apparatus of claim 25, wherein the first tunable wavelength selection element has a first free spectral range that is approximately equal to a multiple of the flee spectral range of the gain medium.

28. The apparatus of claim 25, wherein the second tunable wavelength selection element has a second free spectral range that is approximately equal to a multiple of the free spectral range of the gain medium.

29. The apparatus of claim 25, wherein the selectable wavelength range is at least as great as a gain bandwidth of said gain medium.

30. The apparatus of claim 19, wherein said first and second tunable wavelength selection elements comprise first and second tunable etalons.

31. The apparatus of claim 30, wherein at least one of said first and second tunable etalons is electro-optically tunable.

32. The apparatus of claim 30, wherein at least one of said first and second tunable etalons is angle tuned.

33. The apparatus of claim 30, wherein at least one of said tunable etalons includes first and second surfaces, each said surface having at least one quarter wave dielectric pair layer thereon.

34. The apparatus of claim 30, wherein at least one of said tunable etalons comprises a semiconductor material.

35. The apparatus of claim 34, wherein said tunable etalon includes a thermal control element integrated thereon.

36. The apparatus of claim 30, wherein at least one of said first and second tunable etalons is thermo-optically tunable.

37. The apparatus of claim 36, wherein said tunable etalon is operatively coupled to a thermal controller.

38. The apparatus of claim 36, wherein said tunable etalon is operatively coupled to a thermal reservoir.

39. A method for tuning a light beam, comprising:

positioning a first tunable wavelength selection element in the light beam generated by a gain medium, the first tunable wavelength selection element configured to define a first plurality of tunable transmission peaks having a first adjustable free spectral range, the first plurality of tunable transmission peaks within a gain bandwidth of the gain medium;

positioning a second tunable wavelength selection element in the light beam, the second tunable wavelength selection element configured to define a second plurality of tunable transmission peaks having a second adjustable free spectral range, the second plurality of tunable transmission peaks within the gain bandwidth of the gain medium; and concurrently tuning the first and second tunable wavelength selection elements to align one of the first plurality of transmission peaks with one of the second plurality of transmission peaks via a Vernier tuning effect to define a single joint transmission peak.

40. The method of claim 39, wherein the first and second adjustable free spectral ranges are adjusted via tuning of the first and second wavelength tunable elements to define a single joint transmission peak within a selected wavelength range.

41. The method of claim 39, further comprising:

providing a gain medium having first and second facets;

emitting the light beam from the first facet; and positioning a reflective element in the light beam after the first and second tunable wavelength selection elements, the reflective element and the second facet of the gain medium defining an external laser cavity.

42. The method of claim 41, wherein the first and second tunable wavelength selection elements are tuned to define a plurality of joint transmission peaks having a joint free spectral range that is at least as great as a gain bandwidth of the gain medium.

43. The method of claim 41, wherein the first free spectral range is approximately equal to a multiple of a free spectral range of the gain medium.

44. The method of claim 43, wherein the second free spectral range is approximately equal to a multiple of the gain medium free spectral range.

45. The method of claim 39, wherein;

positioning the first tunable wavelength selection element comprises positioning a first tunable etalon in the light beam; and positioning the second tunable wavelength selection element comprises positioning a second tunable etalon in the light beam.

46. The method of claim 45, wherein concurrently tuning the first and second tunable wavelength selection elements comprises thermo-optically tuning the first and second tunable etalons.

47. The method of claim 46, wherein said thermo-optically tuning comprises;

thermally adjusting a refractive index of the first tunable etalon; and thermally adjusting a refractive index of the second tunable etalon.

48. The method of claim 47, wherein said thermo-optically tuning further comprises:

thermally adjusting a physical thickness of the first tunable etalon; and thermally adjusting a physical thickness of the second tunable etalon.

49. A method for laser operation, comprising:

emitting a light beam from a first facet of a gain medium:

positioning an end reflector in the light beam, the end reflector and a second facet of the gain medium defining an external laser cavity;

positioning first and second tunable wavelength selection element in the light beam between the first facet of the gain medium and the end reflector, the first and second tunable wavelength selection elements respectively configured to define first and second pluralities of tunable transmission peaks having respective first and second free spectral ranges, the first and second pluralities of tunable transmission peaks within a gain bandwidth of the gain medium;

defining a single joint transmission peak from said first and second pluralities of transmission peaks; and adjusting the joint transmission peak by concurrently tuning the first and second tunable wavelength selection elements.

50. A laser apparatus comprising:

gain means for emitting a light beam; and first and second tunable means for wavelength selection of the light beam, each configured to define a respective plurality of transmission peaks and having respective tunable free spectral ranges, wherein each respective plurality of tunable transmission peaks within a gain bandwidth of the gain means; and control means for tuning the first and second tunable means for wavelength selection to produce a tunable joint transmission peak by aligning one of the transmission peaks for each of the first and second plurality of transmission peaks using a Vernier turning effect.

51. The apparatus of claim 50, further comprising means for defining an external laser cavity, said first and second tuning means positioned in said external laser cavity.

52. The apparatus of claim 50, wherein said first and second tunable means comprise first and second thermo-optic etalon means for wavelength selection of said light beam.

53. A laser apparatus, comprising a base;

an end reflector, operatively coupled to the base;

a gain medium, operatively coupled to the base, having a first facet from which a light beam is emitted in response to an electric input and a second facet opposite the first facet, the second facet and the reflector defining an external laser cavity having a first adjustable free spectral range and providing a plurality of lasing modes having a first plurality of transmission peaks within a gain bandwidth of the gain medium; and a tunable wavelength selection element operatively coupled to the base and positioned between the first facet and the reflector, configured to define a second plurality of tunable transmission peaks having a second adjustable free spectral range, the second plurality of tunable transmission peaks within the gain bandwidth of the gain medium, wherein the first adjustable free spectral range is related to the second adjustable free spectral range such that the first and second plurality of transmission peaks may be adjusted to generate a tunable joint transmission peak via a Vernier tuning effect.

54. The laser apparatus of claim 53, wherein the tunable wavelength selection element comprises an etalon.

55. The laser apparatus of claim 53, wherein the first free spectral range ($FSR_1$) is related to the second free spectral range ($FSR_2$) by the equation:

$$K(FSR_2) \approx (M/M+N)(FSR_1)$$

wherein K is a rational fraction, M is the total number of tunable wavelengths within a selected wavelength range, and N is a non-integer or integer number that is selectable.

56. The laser apparatus of claim 53, wherein the tunable wavelength selection element comprises a wedge-shaped etalon that is positioned via a micro-electro-mechanical systems (MEMS) actuator.

* * * * *

UNITED STATES PATENT AND TRADEMARK OFFICE
CERTIFICATE OF CORRECTION

| | |
|---|---|
| PATENT NO. | : 6,853,654 B2 |
| APPLICATION NO. | : 10/099649 |
| DATED | : February 8, 2005 |
| INVENTOR(S) | : McDonald et al. |

Page 1 of 6

It is certified that error appears in the above-identified patent and that said Letters Patent is hereby corrected as shown below:

In the Claims

Col. 23 line 47 through Col. 28 line 45, Delete claims 1-56, and insert the attached set of claims.

1. An apparatus, comprising:

a first tunable wavelength selection element configured to define a first plurality of tunable transmission peaks separated by a first adjustable free spectral range, the first plurality of tunable transmission peaks within a gain bandwidth of a gain medium optically couplable to the optical tuning apparatus;

a second tunable wavelength selection element configured to define a second plurality of tunable transmission peaks separated by a second adjustable free spectral range, the second plurality of tunable transmission peaks within the gain bandwidth of the gain medium; and a controller, operatively coupled to each of the first and second tunable wavelength selection elements, to adjust the first and second free spectral ranges to produce at least one tunable joint transmission peak, wherein each of said at least one tunable joint transmission peak comprises a respective pair of transmission peaks, one from each of the first and second plurality of tunable transmission peaks, that are aligned, and said at least one tunable transmission peak is tuned using a Vernier tuning effect.

UNITED STATES PATENT AND TRADEMARK OFFICE
CERTIFICATE OF CORRECTION

PATENT NO. : 6,853,654 B2
APPLICATION NO. : 10/099649
DATED : February 8, 2005
INVENTOR(S) : McDonald et al.

It is certified that error appears in the above-identified patent and that said Letters Patent is hereby corrected as shown below:

2. The apparatus of claim 1, wherein said at least one joint transmission peak is adjustable according to tuning of said first and second tunable wavelength selection elements.

3. The apparatus of claim 1, wherein said first and second tunable wavelength selection elements comprise at least one etalon.

4. The apparatus of claim 1, wherein said first and second tunable wavelength selection elements comprise at least one grating.

5. The apparatus of claim 1, wherein said first and second tunable wavelength selection elements comprise first and second etalons.

6. The apparatus of claim 5, wherein at least one of said first and second etalons is a tunable air gap etalon.

7. The apparatus of claim 1, wherein the first and second tunable wavelength selection elements are configured in a birefringent etalon.

8. The apparatus of claim 5, wherein at least one of said first and second etalons is angle tuned.

9. The apparatus of claim 5, wherein at least one of said first and second etalons comprises a wedge-shaped etalon that is positioned via a micro-electro-mechanical systems (MEMS) actuator.

10. The apparatus of claim 5, wherein at least one of said first and second etalons includes first and second surfaces, each said surface having at least one quarter wave dielectric pair layer thereon.

UNITED STATES PATENT AND TRADEMARK OFFICE
CERTIFICATE OF CORRECTION

PATENT NO.       : 6,853,654 B2
APPLICATION NO.  : 10/099649
DATED            : February 8, 2005
INVENTOR(S)      : McDonald et al.

It is certified that error appears in the above-identified patent and that said Letters Patent is hereby corrected as shown below:

11. The apparatus of claim 1, further comprising a beam splitter positioned in a light beam generated by the gain medium, the beam splitter positioned before the first and second tunable wavelength selection elements, the beam splitter to pass a first_light beam to the first tunable wavelength selection element and to pass a second light beam to the second tunable wavelength selection element.

12. The apparatus of claim 5, wherein said controller comprises a thermal controller, wherein the first and second etalons are thermo-optically tunable.

13. The apparatus of claim 1, wherein a rear facet of the gain medium and a reflector optically couplable to the gain medium define an external laser cavity of the apparatus, wherein the external laser cavity serves as the second tunable wavelength selection element.

14. A laser apparatus, comprising a base;

a gain medium, operatively coupled to the base, to emit a light beam in response to an electric input;

a first tunable wavelength selection element operatively coupled to the base and positioned in the light beam, configured to define a first plurality of tunable transmission peaks having a first adjustable free spectral range, the first plurality of tunable transmission peaks within a gain bandwidth of the gain medium;

a second tunable wavelength selection element operatively coupled to the base and positioned in the light beam, configured to define a second plurality of tunable

UNITED STATES PATENT AND TRADEMARK OFFICE
CERTIFICATE OF CORRECTION

PATENT NO.        : 6,853,654 B2
APPLICATION NO.   : 10/099649
DATED             : February 8, 2005
INVENTOR(S)       : McDonald et al.

It is certified that error appears in the above-identified patent and that said Letters Patent is hereby corrected as shown below:

transmission peaks having a second adjustable free spectral range, the second plurality of tunable transmission peaks within the gain bandwidth of the gain medium; and a controller, operatively coupled to each of the first and second tunable wavelength selection elements, to tune a wavelength of an optical output produced by the laser apparatus by concurrently adjusting the first and second free spectral ranges of the first and second tunable wavelength selection elements to define a single joint transmission peak within a selectable wavelength range and adjustable in phase according to tuning of said first and second tunable wavelength selection elements.

15. The laser apparatus of claim 14, wherein the gain medium comprises a laser diode having first and second facets defining an internal cavity having a free spectral range and emitting the light beam from the first facet.

16. The laser apparatus of claim 15, further comprising a reflective element positioned in said light beam after the first and second tunable wavelength selection elements, the reflective element and the second facet of the gain medium defining an external cavity.

17. The laser apparatus of claim 15, wherein the first tunable wavelength selection element has a first free spectral range that is approximately equal to a multiple of the free spectral range of the gain medium.

18. The laser apparatus of claim 15, wherein the second tunable wavelength selection element has a second free spectral range that is approximately equal to a multiple of the free spectral range of the gain medium.

UNITED STATES PATENT AND TRADEMARK OFFICE
CERTIFICATE OF CORRECTION

| | |
|---|---|
| PATENT NO. | : 6,853,654 B2 |
| APPLICATION NO. | : 10/099649 |
| DATED | : February 8, 2005 |
| INVENTOR(S) | : McDonald et al. |

It is certified that error appears in the above-identified patent and that said Letters Patent is hereby corrected as shown below:

19. The laser apparatus of claim 15, wherein the selectable wavelength range is at least as great as a gain bandwidth of said gain medium.

20. The laser apparatus of claim 14, wherein said first and second tunable wavelength selection elements comprise at least one etalon.

21. The laser apparatus of claim 14, wherein said first and second tunable wavelength selection elements comprise at least one grating.

22. The laser apparatus of claim 14, wherein said first and second tunable wavelength selection elements comprise first and second tunable etalons.

23. The laser apparatus of claim 22, wherein at least one of said first and second tunable etalons is thermo-optically tunable.

24. The laser apparatus of claim 22, wherein at least one of said first and second tunable etalons is electro-optically tunable.

25. The laser apparatus of claim 22, wherein at least one of said first and second tunable etalons is angle tuned.

26. The laser apparatus of claim 22, wherein at least one of said tunable etalons comprises a semiconductor material.

27. The laser apparatus of claim 22, wherein at least one of said tunable etalons includes first and second surfaces, each said surface having at least one quarter wave dielectric pair layer thereon.

UNITED STATES PATENT AND TRADEMARK OFFICE
CERTIFICATE OF CORRECTION

PATENT NO. : 6,853,654 B2
APPLICATION NO. : 10/099649
DATED : February 8, 2005
INVENTOR(S) : McDonald et al.

It is certified that error appears in the above-identified patent and that said Letters Patent is hereby corrected as shown below:

28. The laser apparatus of claim 26, wherein said tunable etalon includes a thermal control element integrated thereon.

29. The laser apparatus of claim 23, wherein said tunable etalon is operatively coupled to a thermal controller.

30. The laser apparatus of claim 23, wherein said tunable etalon is operatively coupled to a thermal reservoir.

Signed and Sealed this

Ninth Day of September, 2008

JON W. DUDAS
*Director of the United States Patent and Trademark Office*